(12) United States Patent
Okuyama

(10) Patent No.: US 6,886,154 B2
(45) Date of Patent: Apr. 26, 2005

(54) MULTIPLE-EXPOSURE DRAWING APPARATUS AND METHOD THEREOF

(75) Inventor: Takashi Okuyama, Saitama (JP)

(73) Assignee: PENTAX Corporation, Tokyo (JP)

( * ) Notice: Subject to any disclaimer, the term of this patent is extended or adjusted under 35 U.S.C. 154(b) by 423 days.

(21) Appl. No.: 10/212,704

(22) Filed: Aug. 7, 2002

(65) Prior Publication Data

US 2003/0031365 A1 Feb. 13, 2003

(30) Foreign Application Priority Data

Aug. 8, 2001 (JP) .................................... P2001-240411

(51) Int. Cl.[7] ............................................. G06F 17/50
(52) U.S. Cl. ............................. 716/21; 716/19; 716/1
(58) Field of Search ............................. 716/21, 19, 1; 430/30, 22; 347/239; 382/194

(56) References Cited

U.S. PATENT DOCUMENTS

| | | | |
|---|---|---|---|
| 4,888,616 A | * 12/1989 | Nanamura et al. ............. | 399/6 |
| 5,049,901 A | 9/1991 | Gelbart ........................ | 347/239 |
| 5,079,544 A | * 1/1992 | DeMond et al. .............. | 345/84 |
| 5,955,776 A | * 9/1999 | Ishikawa .................... | 257/618 |
| 6,251,550 B1 | 6/2001 | Ishikawa ..................... | 430/22 |

FOREIGN PATENT DOCUMENTS

JP 9-17718 1/1997

* cited by examiner

Primary Examiner—A. M. Thompson
Assistant Examiner—Sun James Lin
(74) Attorney, Agent, or Firm—Greenblum & Bernstein, P.L.C.

(57) ABSTRACT

A multi-exposure drawing apparatus for drawing a given pattern on a workpiece is provided. The apparatus uses an exposure unit with optical modulation elements arranged in a matrix. The apparatus comprises a first, second, and third memory, a coordinate transformation processor, a calculation processor, and an exposure-data generating processor. The first, second, and third memory respectively stores raster-data of the given pattern, first-coordinate data representing a position of each optical modulation element, and second-coordinate data representing a position of the exposure unit. The coordinate transformation is performed for the first-coordinate data. Address-data is calculated in accordance with a pixel size of the raster-data, and is based on the sum of the first and second coordinate data. Exposure-data generated by outputting the raster-data of the address-data is given to each of the optical modulation elements. The given pattern is drawn on the drawing surface as to the exposure-data.

5 Claims, 12 Drawing Sheets

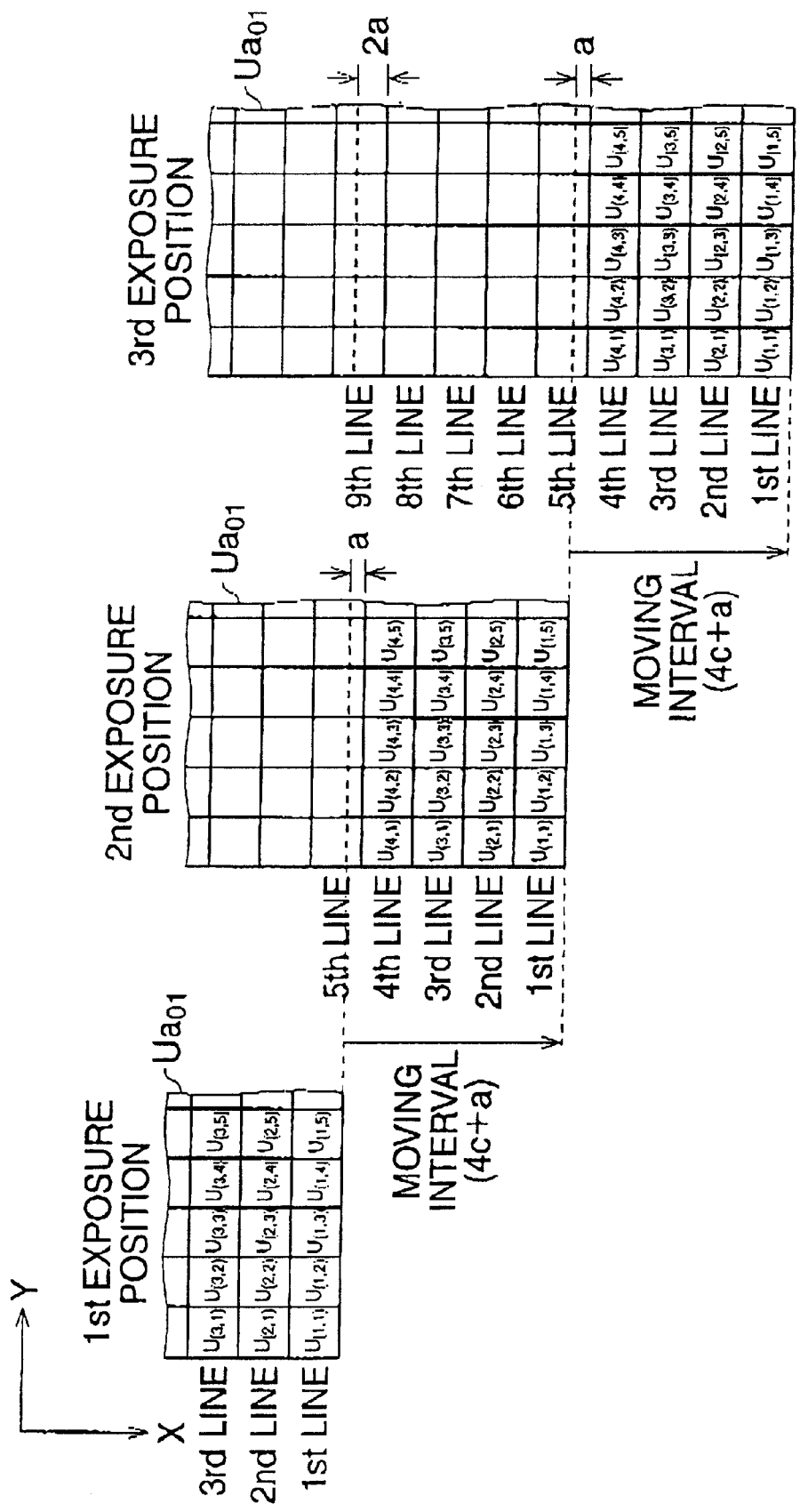

FIG. 9

| $L_x$ \ $R_y$ | 0001 | 0002 | 0003 | ---------- | 1278 | 1279 | 1280 |
|---|---|---|---|---|---|---|---|
| 000001 | B | B | B | ---------- | B | B | B |
| 000002 | B | B | B | ---------- | B | B | B |
| 000003 | B | B | B | ---------- | B | B | B |
| 000004 | B | B | B | ---------- | B | B | B |
| 000005 | B | B | B | ---------- | B | B | B |
| 000006 | B | B | B | ---------- | B | B | B |
| ⋮ | ⋮ | ⋮ | ⋮ | ⋮ | ⋮ | ⋮ | ⋮ |

MULTIPLE-EXPOSURE DRAWING APPARATUS AND METHOD THEREOF

BACKGROUND OF THE INVENTION

1. Field of the Invention

The present invention relates to a method and a drawing apparatus with an exposure unit that includes a plurality of modulation elements arranged in a matrix, for producing patterns on a surface of a workpiece.

2. Description of the Related Art

The above drawing apparatus is generally used to produce minute and fine patterns, characters, symbols, and so on, on suitable workpieces by an optical method. An example of a use of the drawing apparatus is for a circuit pattern drawn on a workpiece when a printed circuit board is manufactured by using photolithography. The workpiece may be either a photosensitive film for producing a photomask or a photoresist layer formed on a suitable substrate.

In recent years, the entire circuit board production process, from the circuit-board pattern designing process to the image-producing process, has been integrated and systematized into an integrated system in which a drawing apparatus plays a part. The integrated system is also provided with a CAD (Computer Aided Design) station, which is used for designing circuit patterns, and a CAM (Computer Aided Manufacturing) station, which processes vector data of the circuit patterns generated by the CAD station and produces work instructions. Vector data produced by the CAD station or processed by the CAM station are transferred to the drawing apparatus where the data are rasterized (vector-to-raster data conversion) and are then stored in a memory as bitmap data.

For example, an exposure unit having DMD (Digital Micro-mirror Device) array or LCD (Liquid Crystal Display) array is known; a DMD is a device with inclinable mirrors supported above each of memory cell that are arranged two-dimensionally in the silicone back plane. As is generally known, micro-mirror elements are arranged in a matrix on a reflective plane of a DMD and the light reflecting or inclined direction of each micro-mirror element is independently controlled. Therefore, light beams substantially uniformly made incident onto the whole reflecting plane of the DMD are individually reflected by each micro-mirror element and split into a plurality of beams, so that each micro-mirror element functions as a modulation element. In the LCD arrays, liquid crystal is intervened between a pair of transparent plate members, and multiple pairs of minute transparent electrode elements are complementary arranged in a matrix on each transparent plate. Transmissivity of the liquid crystal between each pair of electrode members is controlled by a voltage applied to each pair of electrode members, thereby each piece of the liquid crystal disposed between a pair of electrode members functions as a modulation element.

The drawing apparatus is provided with a light source which has suitable photosensitive characteristics for the workpiece, such as a supper high-pressured mercury-vapor lamp, a xenon lamp, a flash tube, LED (Light Emitting Diode), laser, and so on, and an exposure unit has an imaging optical system or a focusing lens system. Light beams from the light source are lead to the exposure unit through an illumination optical system or illuminating lens system. Each of the modulation units in the exposure unit modulates the incident light beams in accordance with the raster-data of the designed circuit pattern, thereby the workpiece is exposed and the circuit pattern is optically produced on the workpiece. The size of a pixel for the circuit patterns projected on the workpiece relates to the size of the modulation element. For example, when the magnification of the above imaging optical system is "1", the pixel size for the projected circuit pattern and the modulation element size are substantially the same.

In general, the area of the circuit pattern to be produced on the workpiece is considerably larger than the area which can be exposed by an exposure unit or multiple units. Therefore, it is necessary to scan the workpiece with an exposure unit to produce the whole circuit pattern on the workpiece. Namely, to obtain the entire circuit pattern, it is necessary to produce each part of the circuit pattern in turn while moving the exposure unit relatively to the workpiece. Conventionally, a drawing table that is movable in a predetermined scanning direction, for example, is provided with the drawing apparatus. An exposure unit is fixed above the path of the drawing table and a workpiece is disposed at a predetermined position on the drawing table. The drawing table is intermittently moved along the scanning direction and only while the drawing table is at rest is each part of the circuit pattern produced in turn on a corresponding part of the workpiece. Hence the entire is circuit pattern is obtained as an assembly of consecutive parts of the circuit pattern. The above image-producing method is called the Step & Repeat method.

Further, an exposure unit with a laser beam scanning optical system, for example, is also known as another type of exposure unit. A drawing apparatus with an exposure unit of this type modulates laser beams, by using image data (raster-data), along a scanning line while scanning the workpiece with laser beams deflected to a direction that traverses the path of the workpiece translation, so that a required circuit pattern is provided.

The resolution of a circuit pattern produced by the above-discussed types of drawing apparatus is defined by the pixel size or a dot size that is predetermined for each drawing apparatus. Namely, for the drawing apparatus with modulation elements arranged in a matrix, the resolution of a circuit pattern is defined by the size of each modulation element or the pixel size. Also, in the drawing apparatus including the laser beam scanner, the size of the pixels is determined by the diameter of the scanning laser beam.

Accordingly, conventionally, when a circuit pattern is designed on a CAD or CAM station, it is necessary to coincide the pixel size of the circuit pattern to be designed with the pixel size determined by a drawing apparatus used. Thus, flexibility of circuit pattern design is restricted by the drawing apparatus. In other words, various types of drawing apparatuses must be prepared and used in the aforesaid circuit pattern drawing system, before the flexibility of circuit pattern design can be increased in the CAD or CAM station.

Further, in actual drawing processes, the positions of a circuit pattern to be drawn on individual workpieces differ, and also workpieces themselves can slightly expand or contract and become deformed. Therefore, conventionally, when a circuit pattern is required to be drawn after an accidental rotation of a workpiece or if a rotation of the pattern is required for some reason, the workpiece and an optical system are relatively rotated. Further, when a translation or scaling (scale-up or down) is required, it is achieved by using exclusive hardware attached to the apparatus. Thereby, the number of elements is increased, so that complex machine control is required and this may induce failure. Furthermore, when a straight line, in an original pattern, is transformed to an inclined line or a curved line by a coordinate transformation, a jagged edge which relates to the pixel size may be generated, so that a smooth line cannot be obtained.

SUMMARY OF THE INVENTION

Therefore, an object of the present invention is to provide a multi-exposure drawing apparatus and a method for drawing a pattern on a surface of a workpiece, using an exposure unit including a plurality of optical modulation elements arranged in a matrix, which is constituted such that the pattern can be properly drawn regardless of the predetermined pixel size of the pattern data, and even when rotation, translation, or scaling of the pattern is required.

According to the present invention, a multi-exposure drawing apparatus is provided for drawing a given pattern on a drawing surface by using a multi-exposure method. The apparatus comprises an exposure unit including a plurality of optical modulation elements arranged in a matrix, a first, second, and third memory, a coordinate transformation processor, a calculation processor, and an exposure-data generating processor.

The first memory stores raster-data for the pattern and the second memory stores first-coordinate data which represents the position of each optical modulation element relative to the drawing surface. Further, the third memory stores second-coordinate data which represents the position of the exposure unit relative to the drawing surface. The coordinate transformation processor can perform a coordinate transformation on either of the first-coordinate data or the second-coordinate data. The calculating processor calculates address-data in accordance with the pixel size used for the raster-data, and based on the sum of the first-coordinate data and the second-coordinate data. The exposure-data generating processor generates exposure-data for each of the optical modulation elements by means of outputting the raster-data corresponding to the address-data from the first memory. Further a pattern that is obtained by performing an inverse of the coordinate transformation to the given pattern is drawn on the drawing surface as a result of the coordinate transformation performed on one of the first-coordinate data and the second-coordinate data.

Further, according to the present invention, a multi-exposure drawing method is provided that is for drawing a given pattern on a drawing surface by a multi-exposure method, using an exposure unit including a plurality of optical modulation elements arranged in matrix, which comprises following steps from a first to seventh step.

In the first step, raster-data of the given pattern is stored in a first memory and in the second step, first-coordinate data which represents the position of each optical modulation element relative to the drawing surface is stored in a second memory. In the third step, second-coordinate data which represents the position of the exposure unit relative to the drawing surface is stored in a third memory. In the fourth step, a coordinate transformation of either the first-coordinate data or the second-coordinate data is performed. In the fifth step, address-data is calculated in accordance with a pixel size of the raster-data, and based on the sum of the first-coordinate data and the second-coordinate data. In the sixth step, exposure-data for each of the optical modulation elements is generated by means of outputting the raster-data corresponding to the address-data from the first memory. In the seventh step, each of the optical modulation elements is operated in accordance with the exposure-data.

Further, a pattern that is obtained by performing an inverse of the coordinate transformation for the given pattern, is drawn on the drawing surface as a result of the coordinate transformation performed on one of the first-coordinate data or the second-coordinate data.

BRIEF DESCRIPTION OF THE DRAWINGS

The objects and advantages of the present invention will be better understood from the following description, with reference to the accompanying drawings in which:

FIGS. 4A–4C conceptually explain a principle of a multi-exposure method carried out by the multi-exposure drawing apparatus, and illustrate sequential states when the exposure units are moved to a plurality of exposure positions along the X-axis of an X-Y coordinate system in sequence;

FIG. 9 is a table conceptually showing a relationship between bit-data, which is stored in the bit-map memory, and address-data thereof;

DESCRIPTION OF THE PREFERRED EMBODIMENTS

Figure 1:
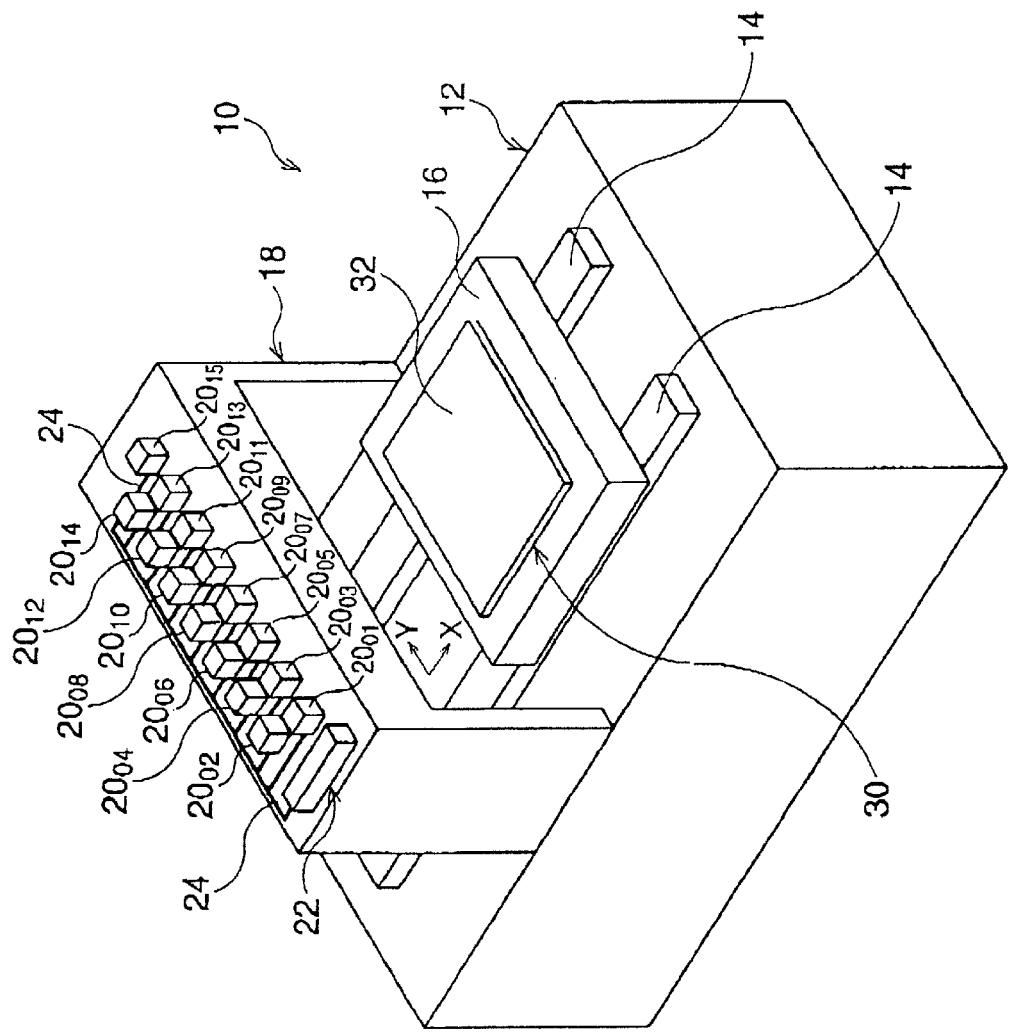
FIG. 1 is perspective view schematically showing a multi-exposure drawing apparatus of an embodiment of the present invention.

The present invention is described below with reference to the embodiments shown in the drawings.

FIG. 1 schematically and perspectively shows an embodiment of the multi-exposure drawing apparatus according to the present invention. The multi-exposure drawing apparatus is constituted to directly draw a circuit pattern on a photoresist layer formed on a suitable substrate, for manufacturing a printed circuit board.

As shown in FIG. 1, the multi-exposure drawing apparatus 10 comprises a base structure 12 installed on a floor. A pair of guide rails 14 is laid on the base structure 12 in parallel, and a drawing table 16 is movably placed on the pair of guide rails 14. Although not illustrated in FIG. 1; the drawing table 16 is relatively moved along the pair of guide rails 14, or along the longitudinal direction X, by a drive motor, such as a stepping motor, a servo motor or the like through a suitable drive mechanism, such as a. ball-screw mechanism. A workpiece 30 having a photoresist layer is mounted and fixed on the drawing table 16 with suitable clamps (not shown).

The apparatus further comprises a bridge-like structure 18, erected so as to straddle the pair of guide rails 14 on the base structure 12, and two arrays of exposure units are arranged on the top surface of the bridge-like structure 18 along the Y direction, which is perpendicular to the direction of movement of the drawing table 16 (X direction). The eight exposure units aligned in the first array are respectively represented by the numbers $20_{01}$, $20_{03}$, $20_{05}$, $20_{07}$, $20_{09}$, $20_{11}$, $20_{13}$, and $20_{15}$ from the left side of the figure. The seven exposure units aligned in the second array behind the first array are respectively represented by the numbers $20_{02}$, $20_{04}$, $20_{06}$, $20_{08}$, $20_{10}$, $20_{12}$, and $20_{14}$ from the left side of the figure.

The exposure units $20_{01}$, $20_{03}$, $20_{05}$, $20_{07}$, $20_{09}$, $20_{11}$, $20_{13}$, and $20_{15}$ in the first array and the exposure units $20_{02}$, $20_{04}$, $20_{06}$, $20_{08}$, $20_{10}$, $20_{12}$, and $20_{14}$ in the second array are arranged in a staggered manner. Namely, the distance between any two adjacent exposure units in an array is equal and is substantially equivalent to the width of an exposure unit. The disposition of the exposure units $20_{02}$, $20_{04}$, $20_{06}$, $20_{08}$, $20_{10}$, $20_{12}$, and $20_{14}$ in the second array is shifted or staggered by a half the array pitch from the disposition of the exposure units $20_{01}$, $20_{03}$, $20_{05}$, $20_{07}$, $20_{09}$, $20_{11}$, $20_{13}$, and $20_{15}$ in the first array.

In the present embodiment, each of the fifteen exposure units $20_{01}$ to $20_{15}$ comprises a DMD (Digital Micro-mirror Device) unit having a reflecting surface which is formed from a plurality of micro-mirror elements arranged in a matrix. For example, a matrix is formed with 1024×1280 (1310720) micro-mirror elements. Each of the exposure units $20_{01}$ to $20_{15}$ is arranged in a matrix so that 1024 micro-mirror elements are aligned along the X direction and 1280 micro-mirror elements are aligned along the Y direction.

At an appropriate position on the top surface of the bridge-like structure 18, such as at the left side of the first exposure unit $20_{01}$ in the figure, a light source device 22 is mounted. Although it is not shown in the figure, the light source device 22 contains a plurality of LED (Light Emitting Device). The light from the LED is condensed and emitted from a light-emitting opening of the light source device 22 as collimated light beams. For the light source device 22, a laser, a supper high-pressured mercury-vapor lamp, a xenon lamp, or a flash tube can be used.

There are fifteen optical fiber cables 24, each with one end optically connected to the light-emitting opening of the light source device 22 and the other end connected to each of the fifteen exposure units $20_{01}$ to $20_{15}$, thereby illumination light from the light source device 22 is introduced to each exposure unit $20_{01}$ to $20_{15}$. Each exposure unit $20_{01}$ to $20_{15}$ modulates the illumination light from the light source device 22, in accordance with the circuit pattern to be drawn, and reflects light beams downward in the figure. Namely, light beams are emitted to the workpiece 30 on the drawing table 16, which is conveyed inside the bridge-like structure 18. Thereby, the photoresist layer formed on the top surface of the workpiece is partly exposed to the reflected light beams. The intensity of the illumination is adjusted in accordance with the sensitivity of a photoresist layer of the workpiece.

Figure 2:
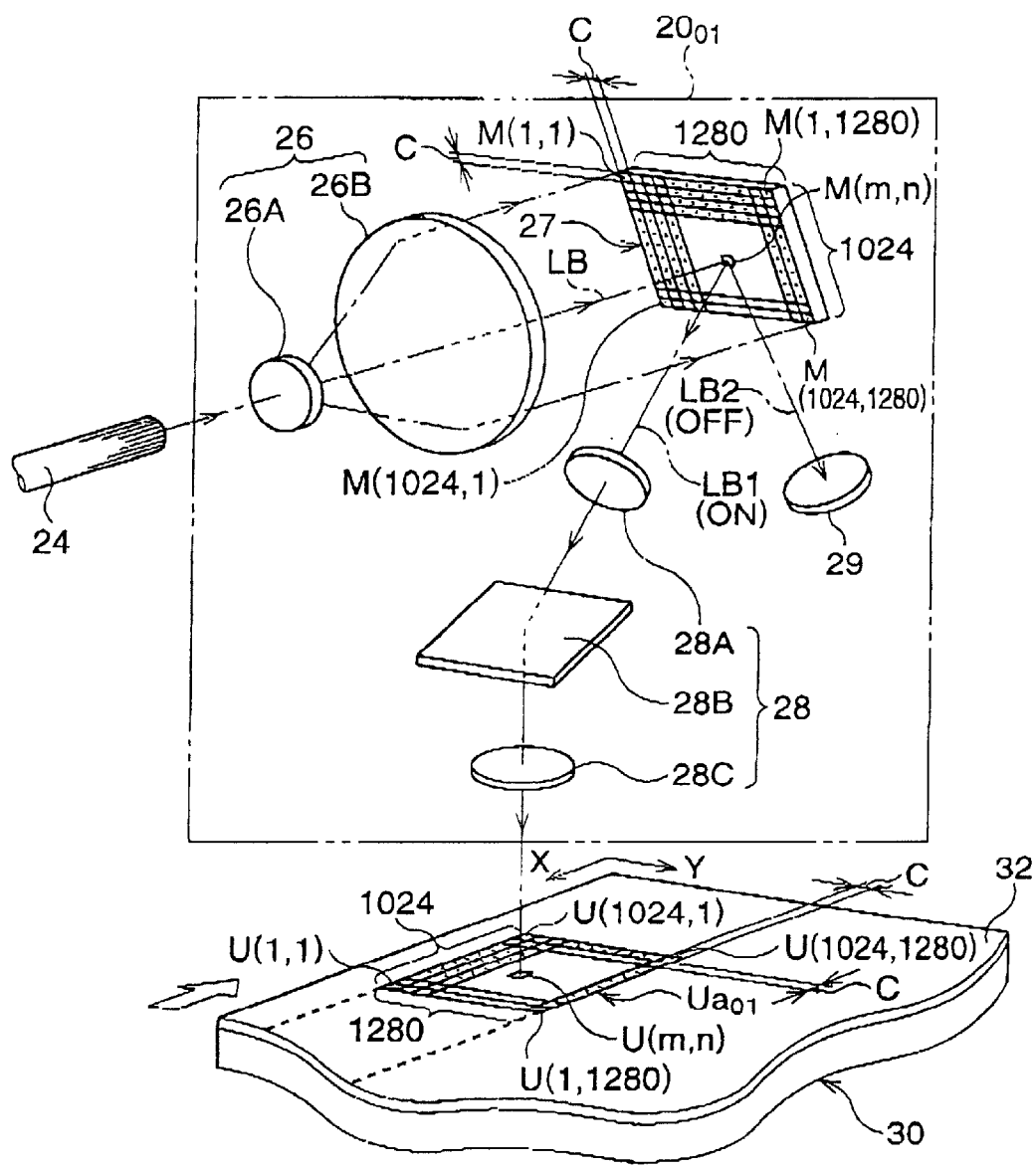
FIG. 2 schematically illustrates a function of an exposure unit used in the multi-exposure drawing apparatus.

Referring to FIG. 2, the main construction of the first exposure unit $20_{01}$ is conceptually illustrated. The other fourteen exposure units $20_{02}$ to $20_{15}$ have the same construction and function as the first exposure unit $20_{01}$, thus an explanation is omitted. The exposure unit $20_{01}$ is provided with an illuminating lens system 26 and a focusing lens system 28. The DMDs 27 are disposed in the light path between the illuminating lens system 26 and the focusing lens system 28. The DMD 27 is a device having a square shaped high-reflectance micro-mirror elements of side length C, which is produced on a wafer by aluminum sputtering and activated by a static electric field action. The 1310720 micro-mirror elements are spread over a silicone memory chip in the manner of a 1024×1280 matrix. Each of the micro-mirror elements is rotatable about its diagonal line and is inclinable, so that the micro-mirror element has two alternative stable positions.

The illuminating lens system 26 includes a convex lens 26A and a collimating lens 26B, and the convex lens 26A is optically connected with the optical fiber cable 24 which is lead from the light source device 22. The light beam emitted from the optical fiber cable 24 is first spread by the convex lens 26A and is then collimated as the parallel light beam LB by the collimating lens 26B, so that the whole of the reflecting surface 24 of the DMD 27 of the first exposure unit $20_{01}$ is uniformly illuminated. The focusing lens system 28 includes two convex lenses 28A and 28C, and a reflector 28B. The reflector 28B is arranged between the two convex lenses 28A and 28C The magnification of the focusing lens system 28 is "1".

Each of the micro-mirror elements in the first exposure unit $20_{01}$ is rotationally movable between a first reflecting position (exposure position), in which the micro-mirror element reflects incident light beams to the focusing lens system 28, and a second reflecting position (non-exposure position), in which the micro-mirror element reflects the incident beams to deviate from the focusing lens system 28. When a micro-mirror element M(m,n) (where $1 \leq m \leq 1024$ and $1 \leq n \leq 1280$) is positioned at the exposure position, a light beam made incident onto the micro-mirror element M(m,n) is reflected to the focusing lens system 28 as indicated with a phantom line $LB_1$. On the other hand, when the micro-mirror element M(m,n) is positioned at the non-exposure position, the light beam is reflected to a light absorption member 29, as indicated with the phantom line $LB_2$, so that the light beam deviates from the focusing lens system 28

A light beam $LB_1$ which is reflected by the micro-mirror element M(m,n) is introduced onto the drawing surface 32 of a workpiece 30 placed on the drawing table 16 through the focusing lens system 28. When the size of each micro-mirror element in the first exposure unit $20_{01}$ is described by C×C, the reflecting surface of the micro-mirror element M(m,n) is projected onto a C×C exposure area U(m,n) on the drawing surface 32, since the magnification of the focusing lens system 28 is "1". For example, the length C of a side of the square area is 20 $\mu$m.

Note that, in the following description, a C×C squared exposure area due to a single micro-mirror element M(m,n) will be referred to as a unit-exposure area U(m,n) and an exposure area formed from all the micro-mirror elements M(1,1) to M(1024,1280) and having the size of (C×1024)× (C×1280) will be referred to as an entire exposure area $Ua_{01}$.

The unit exposure area U(1,1), which corresponds to the micro-mirror element M(1,1), at the upper left corner of the first exposure unit $20_{01}$ in FIG. 2, is positioned at the lower left corner of the entire exposure area $Ua_{01}$. The unit exposure area $U(1024,1)$, which corresponds to the micromirror element $M(1024,1)$ at the lower left corner of the first exposure unit $20_{01}$, is positioned at the upper left corner of the entire exposure area $Ua_{01}$. Further, the unit exposure area $U(1,1280)$, which corresponds to the micro-mirror element $M(1,1280)$ at the upper right corner of the first exposure unit $20_{01}$, is positioned at the lower right corner of the entire exposure area $Ua_{01}$, and the unit exposure area $U(1024, 1280)$, which corresponds to the micro-mirror element $M(1024,1280)$ at the lower right corner of the first exposure unit $20_{01}$, is positioned at the upper right corner of the entire exposure area $Ua_{01}$. In the first exposure unit $20_{01}$, although each micro-mirror element $M(m,n)$ is normally positioned at the non-exposure position, it is rotationally switched to the exposure position from the non-exposure position when exposure is required. The control of the micro-mirror element $M(m,n)$, that is to say the alternative positioning between the non-exposure position and the exposure position, is based upon raster-data of a circuit pattern as will be explained latter. Note that, a light beam $LB_2$ deviating from the focusing lens system 28 is absorbed by the light absorption member 29 so as not to reach the drawing surface 32.

When all of the 1310720 micro-mirror elements in the first exposure unit $20_{01}$, are settled in the exposure position, all of the light beams reflected from all of the micro-mirror elements are made incident to the focusing lens system 28, so that the entire exposure area $Ua_{01}$ for the first exposure unit $20_{01}$ emerges on the drawing surface 32. When the side length C of the unit exposure area $U(m,n)$ is 20 μm, the size of the entire exposure area $Ua_{01}$ is described by a 25.6 mm(=1024×20 μm)×20.48 mm(=1280×20 μm) square and the number of pixels included in the area is 1024×1280.

Figure 3A:
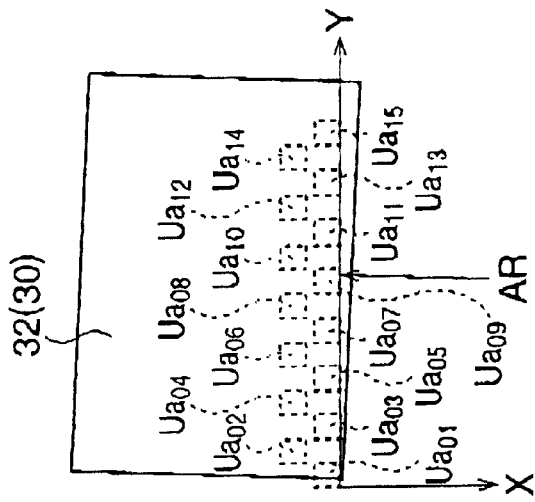
FIGS. 3A–3C schematically show exposure areas produced on a drawing surface of a workpiece disposed on a drawing table of the multi-exposure drawing apparatus illustrated in FIG. 1; the area which is produced by each exposure unit at different phases of the drawing process.
Figure 3B:
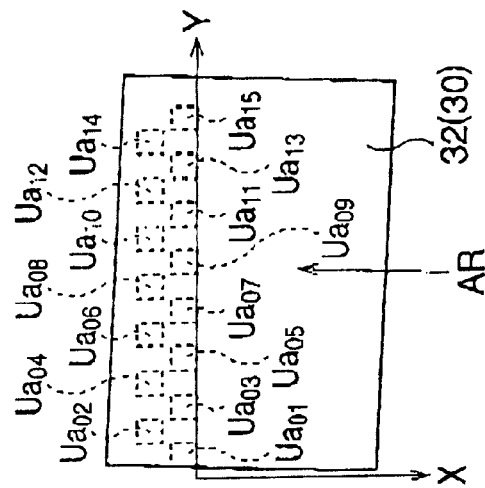
Figure 3C:
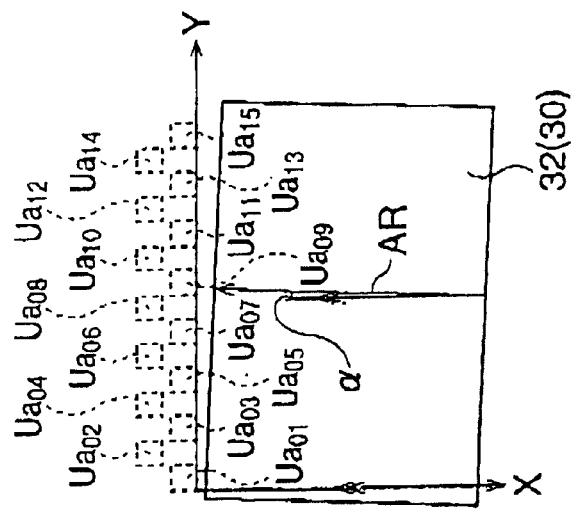

With reference to FIG. 3A to FIG. 3C, a drawing process in the multi-exposure drawing apparatus will be explained. Each of FIGS. 3A–3C is a plan view of the drawing surface 32 of the workpiece 30 and illustrates a different phase of the drawing process. For convenience of the explanation, an X-Y coordinate system is defined on the surface of the drawing surface 32. The rectangular area surrounded by the phantom line represents all the exposure areas $Ua_{01}$ to $Ua_{15}$, which are produced on the X-Y plane by each of the fifteen exposure units $20_{01}$–$20_{15}$. All the exposure areas $Ua_{01}$, $Ua_{03}$, $Ua_{05}$, $Ua_{07}$, $Ua_{09}$, $Ua_{11}$, $Ua_{13}$, and $Ua_{15}$ aligned in the first array are positioned so that the base line of the array in the figure should coincide with the Y-axis. On the other hand, all the exposure areas $Ua_{02}$, $Ua_{04}$, $Ua_{06}$, $Ua_{08}$, $Ua_{10}$, $Ua_{12}$, and $Ua_{14}$ aligned in the second array are positioned so that the base line of the array in the figure should coincide with a line which is parallel to but apart from the Y-axis by a distance S to the negative side of the X-axis.

The X-axis of the X-Y orthogonal coordinate system is normal to the alignment of the exposure units $20_{01}$ to $20_{15}$, thereby the 1310720 (1024×1280) micro-mirror elements in each of the exposure units $20_{01}$ to $20_{15}$ are also arranged in a matrix of which rows and columns are parallel with the X and Y-axes of the X-Y orthogonal coordinate system.

In FIGS. 3A to FIGS. 3C, the origin of the X-Y orthogonal coordinate system is illustrated as if it coincides with the lower left corner of the entire exposure area $Ua_{01}$ produced by the first exposure unit $20_{01}$ in the first array, however, the precise position of the origin is at the center of the unit exposure area $U(1,1)$ which is provided by the leading micro-mirror element $M(1,1)$, in the first line along the Y-axis, of the first exposure unit $20_{01}$. As described above, the size of the unit exposure area is 20 μm×20 μm in the present embodiment, thus the Y-axis is biased by 10 μm from its border inside the entire exposure area $Ua_{01}$ of the first exposure unit 20. In other words, the centers of 1280 micro-mirror elements $M(1, n)$ ($1 \leq n \leq 1280$), which are included in the first line of the eight exposure units $20_{01}$, $20_{03}$, $20_{05}$, $20_{07}$, $20_{09}$, $20_{11}$, $20_{13}$, and $20_{15}$ of the first array, all coincide with the Y-axis.

The drawing surface 32 is moved along the direction indicated by the arrow AR with the drawing table 16. Namely, the drawing table 16 or the drawing surface 32 is moved along a line inclined with respect to the X-axis at an angle "α" and progresses to the negative direction of the X-axis. Accordingly, as the drawing table 16 is moved along the movement direction AR, the entire exposure area $Ua_{01}$ to $Ua_{15}$ is moved in the positive direction of the X-axis relative to the drawing surface 16, and is also relatively shifted along the negative direction of the Y-axis by a predetermined distance. Note that, in FIGS. 3A to 3C, the movement direction of the drawing surface 32 is inclined with respect to the X-axis, the direction maybe set parallel to the X-axis by aligning the arrays of exposure units $20_{01}$–$20_{15}$ so as to be inclined with respect to the Y-axis. The angle α is exaggerated in FIGS. 3A–3C, the actual angle α is very small, as will be explained latter.

For an exposure method of the multi-exposure drawing apparatus, a Step & Repeat method or a method that executes a drawing operation while moving the drawing table 16 at constant speed may be applied. In the Step & Repeat method, operations that intermittently move the drawing table 16 along the scanning direction and operations that project a circuit pattern in part when the drawing table 16 is suspended, are alternately repeated, so that the entire circuit pattern is provided by means of patching a part of the circuit pattern. In the present embodiment, for convenience of the explanation, the Step & Repeat method is applied for the multi-exposure drawing apparatus.

While the drawing operation of the multi-exposure drawing apparatus 10 is carried out, the drawing table 16 is intermittently moved along negative direction of the X-axis, thereby the drawing surface 32 can be scanned by the reflecting light beams from each micro-mirror element in the exposure units $20_{01}$–$20_{15}$. At first, the exposure operations for the exposure units $20_{01}$, $20_{03}$, $20_{05}$, $20_{07}$, $20_{09}$, $20_{11}$, $20_{13}$, and $20_{15}$ of the first array are carried out, and eight entire exposure areas $Ua_{01}$, $Ua_{03}$, $Ua_{05}$, $Ua_{07}$, $Ua_{09}$, $Ua_{11}$, $Ua_{13}$, and $Ua_{15}$ are formed on the drawing surface 32. Then the exposure operations for the exposure units $20_{02}$, $20_{04}$, $20_{06}$, $20_{08}$, $20_{10}$, $20_{12}$, and $20_{14}$ in the second array are carried out after a predetermined time (or after the drawing table 16 is moved by a distance between the leading edges of the eight entire exposure areas and the leading edges of the seven entire exposure areas), and then seven entire exposure areas $Ua_{02}$, $Ua_{04}$, $Ua_{06}$, $Ua_{09}$, $Ua_{10}$, $Ua_{12}$, and $Ua_{14}$ are formed on the drawing surface 32, so that the fifteen entire exposure areas $Ua_{01}$ through $Ua_{15}$ are aligned along the Y-axis on the drawing surface 32. Accordingly, a circuit pattern can be drawn on the drawing surface 32 by the fifteen exposure units $20_{01}$ to $20_{15}$.

In the multi-exposure drawing apparatus 10, a circuit pattern is drawn based on the raster-data of the circuit pattern by moving the drawing table 16 intermittently at predetermined space intervals and by applying the multi-exposure method. A principle of the multi-exposure drawing method applied in the present embodiment will be explained bellow.

Each of FIGS. 4A to 4C sequentially shows a part of the entire exposure area $Ua_{01}$, which is to be projected on the drawing surface 32 by the first exposure unit $20_{O1}$, in series. The entire exposure area $Ua_{O1}$ is comprised of the unit exposure areas U(m,n), which are provided by each of the micro-mirror element M(m,n). The parameter "m" represents a line number of the first exposure unit $20_{O1}$, which is given to a line-alignment parallel to the Y-axis and numbered along the X-axis, and the parameter "n" represents a line number of the first exposure unit $20_{O1}$, which is given to a line-alignment parallel to the X-axis and numbered along the Y-axis. In the present embodiment, the range of the parameters m and n are $1 \leq m \leq 1024$ and $1 \leq n \leq 1280$.

Namely, the unit exposure areas U(1,1), U(1,3), U(1,4), U(1,5), ..., and U(1,1280) are derived from the first line-alignment of the 1280 micro-mirror elements M(1,1), to M(1,1280) along the Y-axis of the first exposure unit $20_{O1}$. Further, the unit exposure areas U(2,1), U(2,3), U(2,4), U(2,5), ..., and U(2,1280) are derived from the second line-alignment of the 1280 micro-mirror elements M(2,1) to M(2,1280) along the Y-axis of the first exposure unit $20_{O1}$. Furthermore, the unit exposure areas U(3,1), U(3,3), U(3,4), U(3,5), ..., and U(3,1280) are derived from the third line-alignment of the 1280 micro-mirror elements M(3,1) to M(3,1280) along the Y-axis of the first exposure unit $20_{O1}$.

In the following explanation, a moving interval of the drawing table 16 for one exposure operation is defined as the sum of a distance "A" and a distance "a" ($0 \leq a < C$), for example. Note that, the distance "A" is an integer-multiple of the size "C" for one unit exposure unit (ex. A=4C). At first, the drawing table 16 is moved in the negative direction of x-axis, thereby the first exposure unit $20_{O1}$ is relatively moved to the positive direction of X-axis in relation to the drawing table 16. When the unit exposure area $Ua_{O1}$ reaches the starting position of the drawing operation, the drawing table 16 is stopped thereupon, so that the first exposure operation is carried out by operating the micro-mirror elements M(1,1), to M(1,1280) in the first line-alignment of the first exposure unit $20_{O1}$ in accordance with raster-data for a predetermined circuit pattern. Herein, the relative position of the drawing surface 32 at this moment is defined as the first exposure position.

When the first exposure operation elapses, the first exposure unit $20_{O1}$ is again relatively moved in the positive direction along the X-axis and is stopped when the unit exposure area $Ua_{O1}$ has moved the distance (A+a), so that the first exposure unit $20_{O1}$ has reached the second exposure position. Then the micro-mirror elements M(1,1), to M(5,1280) in the first to fifth line-alignments of the first exposure unit $20_{O1}$ are operated in accordance with raster-data of a predetermined circuit pattern, so that the second exposure operation is carried out.

When the second exposure operation elapses, the first exposure unit $20_{O1}$ is again relatively moved by the distance (A+a) in the positive direction along the X-axis. Then the first exposure unit $20_{O1}$ is stopped at the third exposure position and the micro-mirror elements M(1,1), to M(9,1280) in the first to ninth line-alignments of the first exposure unit $20_{O1}$ are operated in accordance with raster-data of a predetermined circuit pattern, so that the third exposure operation is carried out.

Accordingly, the drawing surface 32 is multi-exposed by the repetition of the exposure operations, which are carried out whenever the first exposure unit $20_{O1}$ is stopped after the relative movement by the distance (A+a) in the positive direction along the X-axis.

Since the movement of the drawing surface 32 is inclined at the minute angle α with respect to the X-axis, the unit exposure areas U(m,n) are relatively shifted by a certain distance to the negative direction along the Y-axis, whenever the first exposure unit $20_{O1}$ is moved in the positive direction along the X-axis by the distance (A+a).

Figure 5:
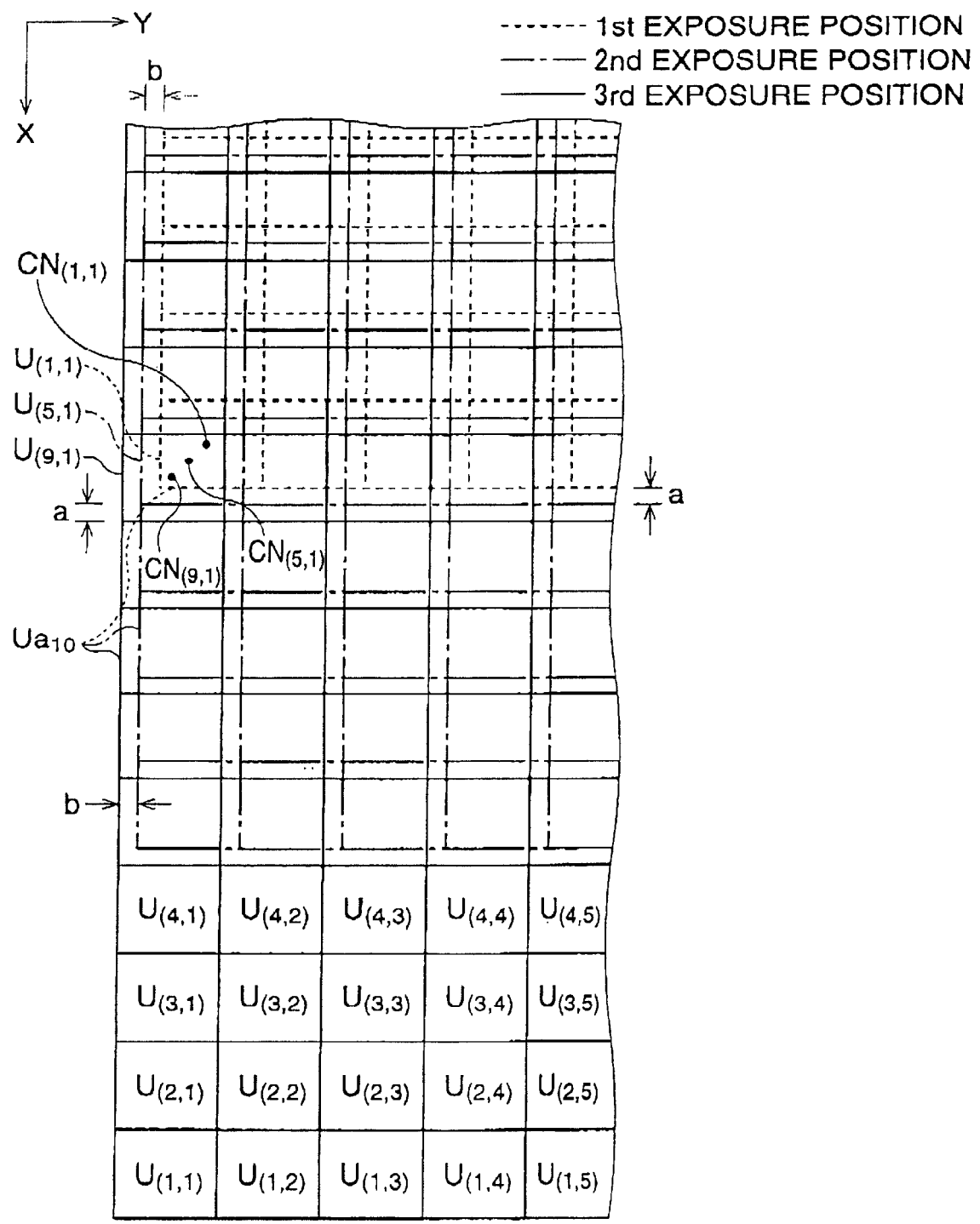
FIG. 5 is another conceptual view explaining a principle of the multi-exposure method, and illustrates shifts of the exposure units along the Y-axis when the exposure units are moved to a plurality of exposure positions in sequence.

FIG. 5 illustrates a deviation in the unit exposure areas U(m,n) as time goes on, when the workpiece 30 is intermittently moved in the direction which is inclined with the X-axis. Referring to FIG. 5, a part of the entire exposure area $Ua_{O1}$ at the first exposure position is represented by broken lines; a part of the entire exposure area $Ua_{O1}$ at the second exposure position is represented by one-dot chain lines; and a part of the entire exposure area $Ua_{O1}$ at the third exposure position is represented by solid lines. Further, the displacement of the unit exposure area U(m,n) along the negative direction of the Y-axis is represented by "b" in the figure.

The unit exposure areas U(1,1) U(1,2), ..., U(1,1280), which are obtained at the first exposure position by the micro-mirror elements M(1,1) to M(1,1280), in the first line-alignment of the first exposure unit $20_{O1}$, and the unit exposure areas U(5,1), U(5,2), ..., U(5,1280), which are obtained at the second exposure position by the micro-mirror elements M(5,1) to M(5,1280) in the fifth line-alignment of the first exposure unit $20_{O1}$, partly overlap each other, since the unit exposure areas U(5,1), U(5,2), ..., U(5,1280) are relatively shifted (+a) along the X-axis and (−b) along the Y-axis with respect to the unit exposure areas U(1,1), U(1,2), ..., U(1,1280). Similarly, the unit exposure areas U(9,1), U(9,2), ..., U(9,1280), which are obtained at the ninth exposure position by the micro-mirror elements M(9,1) to M(9,1280) in the ninth line-alignment of the first exposure unit $20_{O1}$, overlap with the unit exposure areas U(1,1), U(1,2), ..., U(1,1280) and the unit exposure areas U(5,1), U(5,2), ..., U(5,1280), since the unit exposure areas U(9,1), U(9,2), ..., U(9,1280) are relatively shifted (+2a) along the X-axis and (−2b) along the Y-axis. In FIG. 5, three overlapping unit exposure areas U(1,1), U(5,1), and U(9,1) are indicated by a broken indicating-line, one-dot chain indicating-line, and solid indicating line, respectively as an example.

Herein, the relative position of each unit exposure area U(m,n) is represented by the position of the center locus CN(m,n) of the area. Namely, the center locus CN(5,1) of the second exposure position is apart (+a,−b) from the center locus CN(1,1) of the first exposure position and the center locus CN(9,1) of the third exposure position is apart (+2a,−2b) from the center locus CN(1,1) of the first exposure position. Note that, the distance between the adjacent center loci in each line-alignment is identical to the size "C" (=20 μm) of a unit exposure area U(m,n).

As described above, when the drawing table 16 is moved by the distance (4×C+a), which is the sum of four times the side length "C" of a unit exposure area U(m,n) and the distance "a", the center loci can be uniformly distributed in an area of C×C, which has the same size as a unit exposure area U(m,n), by suitably selecting and determining the values of the distances "a" and "b".

Figure 6:
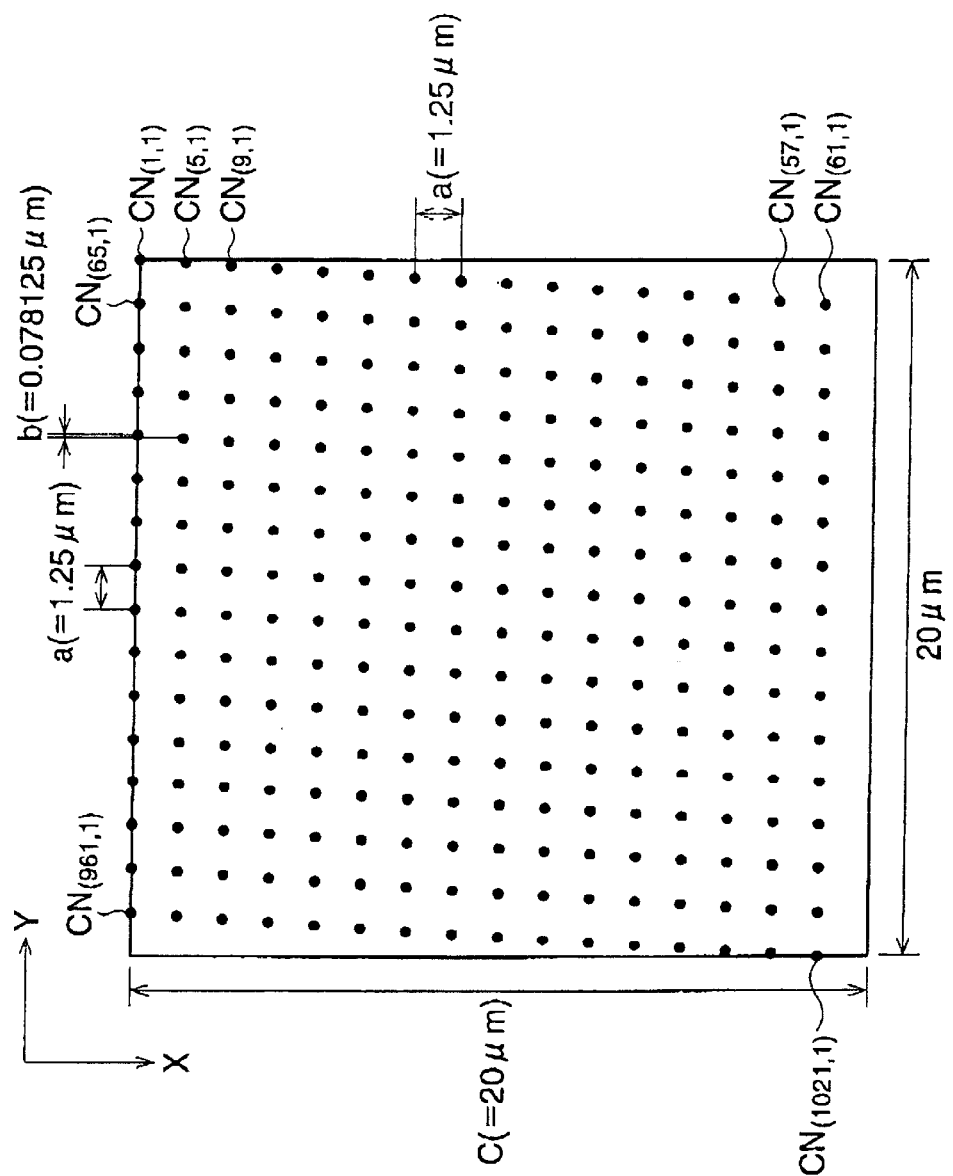
FIG. 6 shows a distribution of the center-loci of the unit exposure areas produced by the exposure units when the exposure units are moved by means of the multi-exposure method.

For example, as shown in FIG. 6, in order to uniformly distribute 256 center loci in the area of C×C (=20 μm×20 μm), the values of the distances "a" and "b" are determined by the following formulas.

$$a = C/16 = 20 \ \mu m/16 = 1.25 \ \mu m$$

$$b = C/256 = 20 \ \mu m/256 = 0.078125 \ \mu m$$

Note that, naturally, determining the distance "b" as 0.078125 μm is identical to determining the inclined angle α for the drawing table therefore shifting the drawing table by 0.078125 μm to the negative direction of the Y-axis when the drawing table 16 moves by the distance (A+a=81.25 μm) in the negative direction of the X-axis compensates for the movement of the drawing table 16 by the angel α.

As it is obvious from the above explanation, in FIG. 6, when a center locus CN(1,1) is for the unit exposure area U(1,1), which is provided by the forefront micro-mirror element M(1,1), in the first line-alignment of the first exposure unit 20$_{01}$ at the first exposure position, the center locus CN(5,1) is for the unit exposure area U(5,1) provided by the forefront micro-mirror element m(5,1) in the fifth line-alignment of the first exposure unit 20$_{01}$ at the second exposure position. Further, a center locus CN(9,1) is for the unit exposure area U(9,1) provided by the forefront micro-mirror element M(9,1) in the ninth line-alignment of the first exposure unit 20$_{01}$ at the third exposure position.

Further, the center locus CN(61,1), which is apart (+16a,−16b) from the center locus CN(1,1), corresponds to a center of the unit exposure area U(61,1) provided by the forefront micro-mirror element M(61,1) in the 61$^{st}$ line-alignment at the 16$^{th}$ exposure position; and the center locus CN(65,1), which is apart (0,−a) from the center locus CN(1,1), corresponds to a center of the unit exposure area U(65,1) provided by the forefront micro-mirror element M(65,1) in the 65$^{th}$ line-alignment at the 17$^{th}$ exposure position. Similarly, the center locus CN(961,1), which is apart (0,−15a) from the center locus CN(1,1), corresponds to a center of the unit exposure area U(961,1) provided by the forefront micro-mirror element M(961,1) in the 961$^{st}$ line-alignment at the 241$^{st}$ exposure position; and the center locus CN(1021,1), which is apart (15a,−16a) from the center locus CN(1,1), corresponds to a center of the unit exposure area U(1021,1) provided by the forefront micro-mirror element M(1021,1) in the 1021$^{st}$ line-alignment at the 256$^{th}$ exposure position.

Consequently, when the drawing table 16 is intermittently moved toward the negative direction of the X-axis under the above conditions (with reference to the fifteen exposure units 20$_{01}$ to 20$_{15}$), center loci CN(m,n) of the unit exposure areas U(m,n), which are provided by each micro-mirror element M(m,n) of the exposure units 20$_{01}$ to 20$_{15}$, are arranged over the entire drawing surface 32 with a pitch "a" along the X-axis and a pitch "b" along the Y-axes. Namely, 256 center loci are uniformly distributed within an area of C×C (20 μm×20 μm) of which the size is equivalent to each unit pixel area.

Note that, it is possible to distribute center loci of unit exposure areas provided by the exposure units 20$_{01}$ to 20$_{15}$ over the whole drawing surface 32 with a higher density. For example, in order to distribute 512 center loci of unit exposure areas within a square of 20 μm×20 μm, the distance "A" is defined as twice the size of the unit exposure area size "C", i.e., 40 μm, and the distance "a" and "b" are defined as 1.25 μm/2 and 0.078125 μm/2, respectively.

Further, in the example shown in FIG. 6, although the 16 center loci of the unit exposure area are aligned along a line parallel to the Y-axis, it is possible to arrange these center loci along a line inclined against the Y-axis by adjusting values of the distances "a" and "b".

As described above, with the multi-exposure drawing apparatus 10 of the present embodiment, a circuit pattern can be drawn anytime, no matter what size of pixel is defined for the raster-data of the circuit pattern. In other words, for the multi-exposure drawing apparatus 10, the concept of pixel size for a circuit pattern is not important.

For example, when the pixel size of the raster-data is set at 20 μm×20 μm, and when a value of "1" is given to any one bit-datum, micro-mirror element M(m,n) which correspond to each center locus CN(m,n) included in a pixel area (20 μm×20 μm) corresponding to the one bit-datum in an exposure operation, are activated in accordance with the above one bit-datum, so that the micro-mirror elements M(m,n) are rotated and their position is altered from the non-exposure position to the exposure position. As a result, the above one pixel area (20 μm×20 μm) is multi-exposed 256 times, totally.

In another example, when the pixel size for the raster-data is set at 10 μm×10 μm, and when a value of "1" is given to any one bit-datum, micro-mirror elements M(m,n) which correspond to each center locus CN(m,n) included in a pixel area (10 μm×10 μm) corresponding to the one bit-datum in an exposure operation, are activated in accordance with the above one bit-datum, so that the micro-mirror elements M(m,n) are rotated and their position is altered from the non-exposure position to the exposure position. As a result, the above one pixel area (10 μm×10 μm) is multi-exposed 64 times, totally.

Note that, the exposure time or the duration for each micro-mirror element M(m,n), the time which the micro-mirror elements are to be maintained at the exposure position, is determined in accordance with the number of exposure operations for a pixel area on the drawing surface 32, the sensitivity of a workpiece (sensitivity of a photoresist layer in the present embodiment), the intensity of a light source device 22, and so on, thereby the desired exposure is obtained for each pixel area.

As described above, in the multi-exposure drawing apparatus 10 of the present embodiment the concept of pixel size is not important, although it is determined for a conventional apparatus. Therefore, even when a circuit pattern is drawn after a coordinate transformation, for example when a line along the abscissa or ordinate is transformed to a slanting line or a curved line, lines or curves are drawn smoothly without being jaggy due to the pixel size. The case will be described latter.

Figure 7:
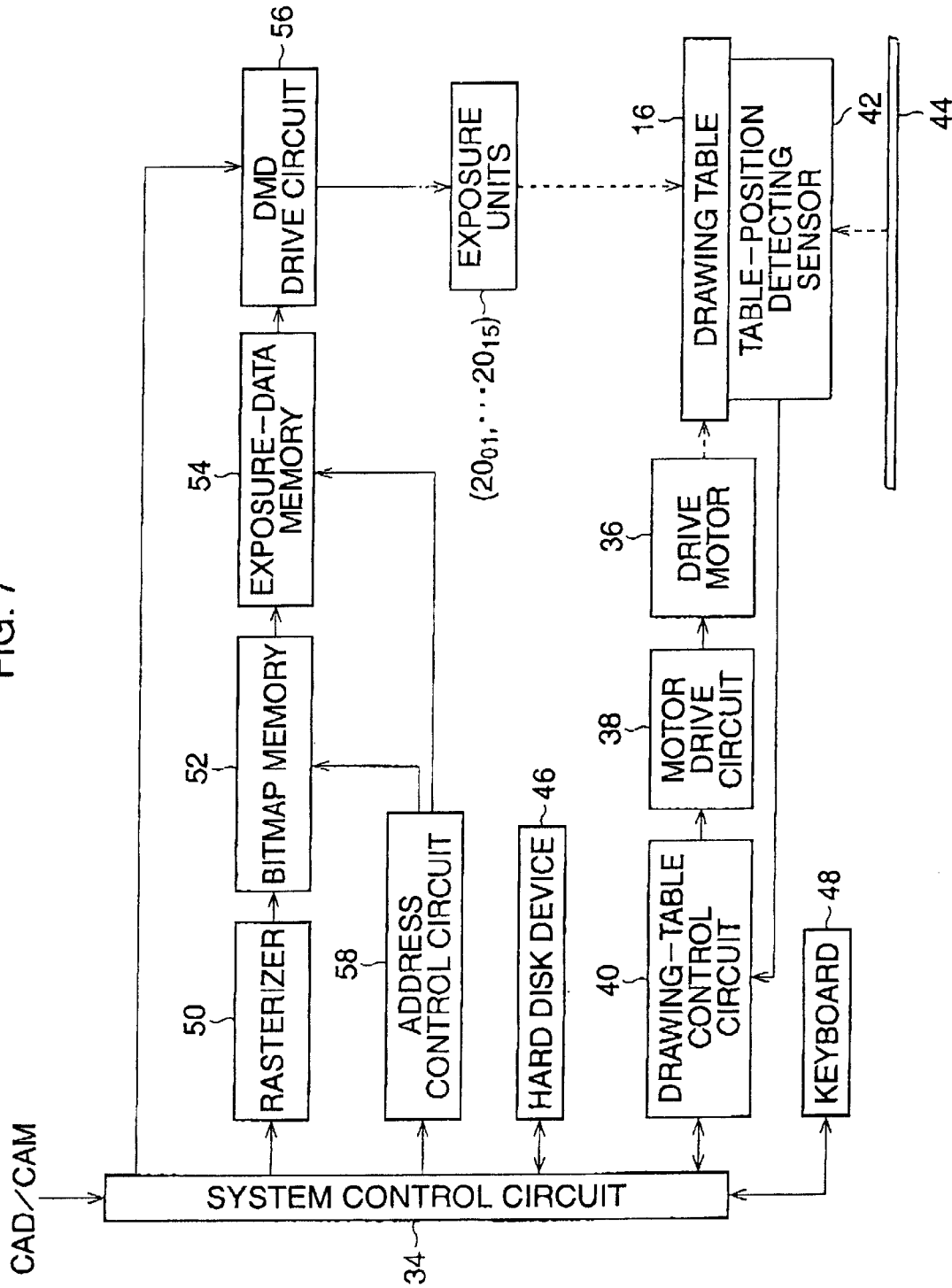
FIG. 7 is a block diagram of the multi-exposure drawing apparatus of the present embodiment.

FIG. 7 is a block diagram of the multi-exposure drawing apparatus. As described in the figure, a system control circuit 34 which is constituted by a microcomputer, is provided in the multi-exposure drawing apparatus 10. Namely, the system control circuit 34 is constituted by a central processing unit (CPU), a read-only memory (ROM) for storing programs and constants, a random access memory (RAM) for storing temporary data, and an input/output interface circuit (I/O), and it generally controls the operation of the multi-exposure drawing apparatus 10.

The drawing table 16 is moved along the X-axis by a drive motor 36. The drive motor 36 is, for example, a stepping motor and is controlled by drive pulse signals fed from a motor drive circuit 38. As mentioned above, a suitable drive mechanism, including a ball-screw mechanism and so on, is located between the drawing table 16 and the drive motor 36, in FIG. 7, it is symbolically represented by an arrow-headed broken line.

The motor drive circuit 38 is operated under the control of a drawing-table control circuit 40. The drawing-table control circuit 40 is connected to a table-position detecting sensor 42 secured to the drawing table 16. The table-position detecting sensor 42 detects a light signal from a linear-scale 44 arranged along the path of the drawing table 16, so that the position of the drawing table 16 along the X-axis is detected. Note that, in FIG. 7, the detection of a light signal from the linear-scale 44 is symbolically represented by an arrow-headed broken line.

The table-position detecting sensor 42 sequentially detects a series of light signals from the linear-scale 44 and outputs as a series of detecting signals (pulses) to the drawing-table control circuit 40. In the drawing-table control circuit 40, the series of detecting signals input thereto is processed by an appropriate method, thereby a series of control clock pulses is generated in accordance with the input detecting signals. From the drawing-table control circuit 40, a series of control clock pulses is fed to the motor-drive circuit 38, so that drive pulses for the drive motor 38 are produced in accordance with a series of control clock pulses. Therefore, the drawing table 16 is moved precisely along the X-axis, according to the accuracy of the divisions of the linear-scale 44.

As shown in FIG. 7, the drawing-table control circuit 40 is connected to the system control circuit 34, thereby the drawing-table control circuit 40 is under the control of the system control circuit 34. On the other hand, a series of detecting signals (pulses) output from the table-position detecting sensor 42 is also input to the system control circuit 34 via the drawing-table control circuit 40, so that the position of the drawing table 16 along the X-axis can be monitored at all times in the system control circuit 34.

The system control circuit 34 is connected to a CAD station or a CAM station through a local area network (LAN), so that vector data of a circuit pattern produced in the CAD station or the CAM station is transferred to the system control circuit 34. A hard disk device 46 is connected to the system control circuit 34 as a data-storing device. When the vector data of a circuit pattern is transferred to the system control circuit 34 from the CAD station or the CAM station, the system control circuit 34 temporally stores the vector data of the circuit pattern in the hard disk device 46. Further, a keyboard 48 is connected to the system control circuit 34 as an external input device, so that various commands and data are input to the system control circuit 34 through the keyboard 48.

A rasterizer (vector-to-raster converter) 50 is operated under the control of the system control circuit 34. Prior to the drawing operation, vector data of a circuit pattern is read from the hard disk device 46 and fed to the rasterizer 50. The vector data is converted to raster-data by the rasterizer 50 and then the raster-data is written in a bitmap memory 52. Namely, a circuit pattern is stored in the bitmap memory 52 as bitmap data. The data conversion process at the rasterizer 50 and the data writing operation for the bitmap memory 52 are carried out in accordance with command signals input to the system control circuit 34 by operating the keyboard 48.

An address control circuit 58 controls the read-write operations from the bitmap memory 52 to an exposure-data memory 54, so that each bit-datum of the bitmap data, a datum that corresponds to each exposure unit, is readout from the bitmap memory 52 and stored in the exposure-data memory 54 as exposure data for each exposure operation. Each bit-datum of exposure data directly corresponds to each micro-mirror element in each exposure unit $20_{01}$ to $20_{15}$, so that each bit-datum defines the alternate positions of each micro-mirror element, that is the exposure position or non-exposure position. When a series of address data is supplied to the exposure-data memory 54 from the address control circuit 58, bit-data is output from the exposure-data memory 54 to the DMD drive circuit 56 in accordance with the above series of address data. The DMD drive circuit 56 individually controls the exposure units $20_{01}$ to $20_{15}$ based on the bit-data from the exposure-data memory 54, thereby whether the exposure operation for each micro-mirror element of the exposure unit is activated is controlled alternatively. The exposure-data is renewed each time the exposure operation of the exposure units $20_{01}$ to $20_{15}$ is repeated. Note that, details of the address data and the exposure data will explained latter.

In FIG. 7, the exposure operation for each micro-mirror element is symbolically represented by an arrow-headed broken line. Further, to avoid a complicated drawing, only one exposure unit is illustrated in FIG. 7 as representative of the others, however, in the actual embodiment, there exist fifteen exposure units $20_{01}$ to $20_{15}$, and of course each of the exposure units is driven by the DMD drive circuit 56.

Figure 8:
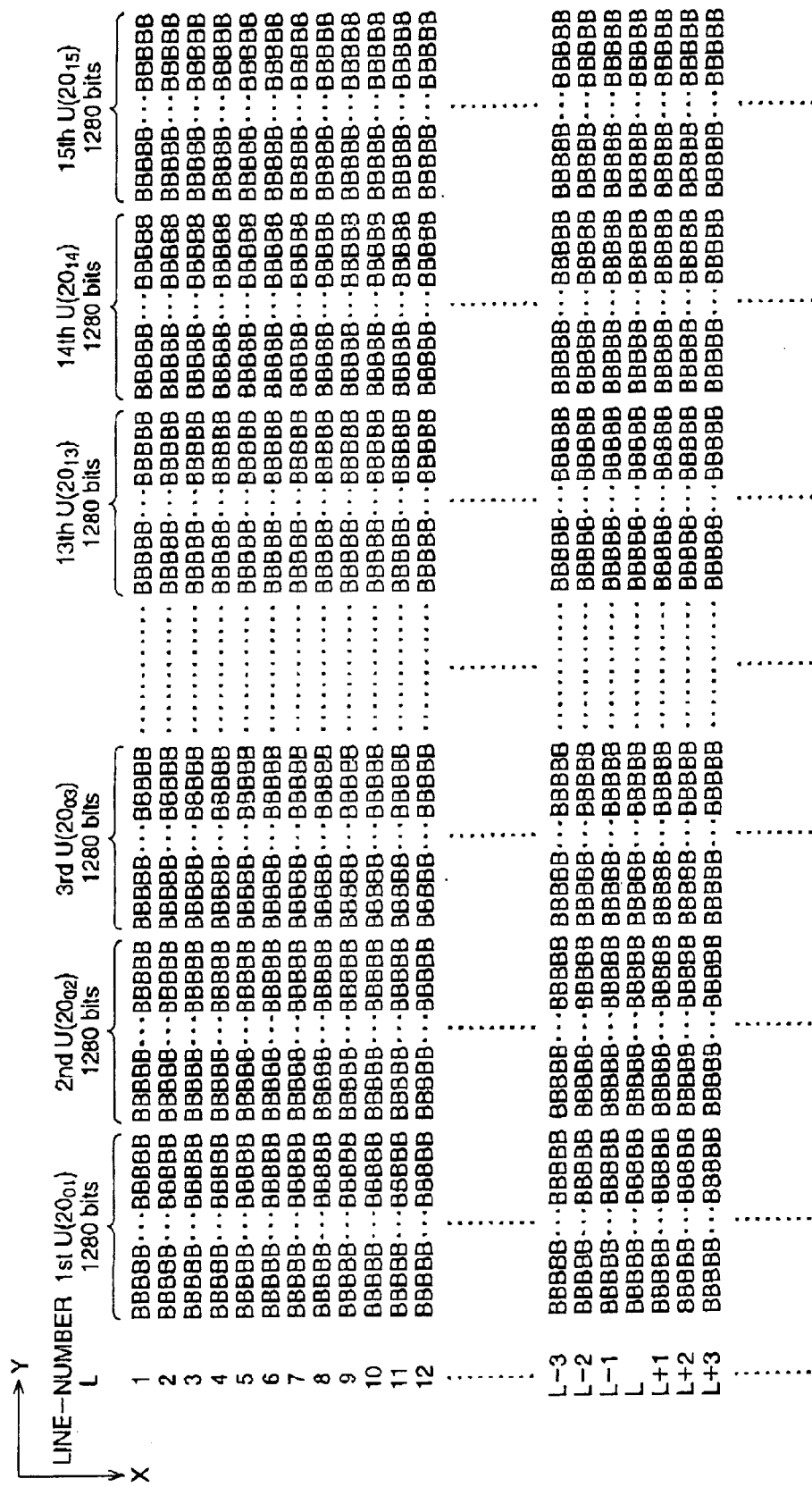
FIG. 8 is a conceptual view showing raster-data developed in a bitmap memory; the raster-data of a circuit pattern to be drawn on a workpiece.

In FIG. 8, a part of the circuit pattern data (raster-data), stored and developed in the exposure-data memory 54, is schematically shown. A line-number L indicated in the figure is the number of lines along the Y-axis in the circuit pattern to be drawn on the drawing surface 32, and each line includes 1280×15 bit-data. As illustrated in the figure, each bit-data is represented by "B", to which a value of either "0" or "1" is given.

According to the present invention, any size of pixel can be used for the circuit pattern data (raster-data), i.e. the size of each bit-data "B", in the design stage. For example, when the size of the bit-data "B" is given as 10 μm×10 μm, the width of a line to be drawn on the drawing surface 32 is 10 μm, and when the size of the bit-data "B" is given as 20 μm×20 μm, the width of a line to be drawn on the drawing surface 32 is 20 μm. Further, when the size of the bit-data "B" is given as 30 μm×30 μm, the width of a line to be drawn on the drawing surface 32 is 30 μm.

As shown in FIG. 8, 1280×15 bit-data included in each line can be divided into a first group to a fifteenth group for each 1280 bits. The exposure operations for each of the eight exposure units $20_{01}$, $20_{03}$, $20_{05}$, $20_{07}$, $20_{09}$, $20_{11}$, $20_{13}$, and $20_{15}$ in the first array are carried out according to the bit-data in the odd numbered groups. Similarly, the exposure operations for each of the seven exposure units $20_{02}$, $20_{04}$, $20_{06}$, $20_{08}$, $20_{10}$, $20_{12}$ and $20_{14}$ in the second array are carried out according to the bit-data in the even numbered groups.

As conceptually shown in FIG. 9, address data $[L_x, R_y]$ is given for every bit-datum "B" of each group. The address data component $L_x$ represents the line-number L, and the address data component $R_y$ represents a bit-number counted from the highest bit in each of the groups. For example, the address data [000001,0001] identifies the bit-datum "B" for the first bit-data of the line-number "1" in each group; the address data [000003,0001] identifies the bit-datum "B" for the first bit-data of the line-number "3" in each group; the address data [000001,1278] identifies the bit-datum "B" for the 1278$^{th}$ bit-data from the first bit-data of the line-number "1" in each group; the address data [000003,1278] identifies the bit-datum "B" for the 1278$^{th}$ bit-data from the first bit-data of the line-number "3" in each group; and the address data [000001,1280] identifies the bit-datum "B" for the last bit-data of the line-number "1" in each group.

Figure 10:
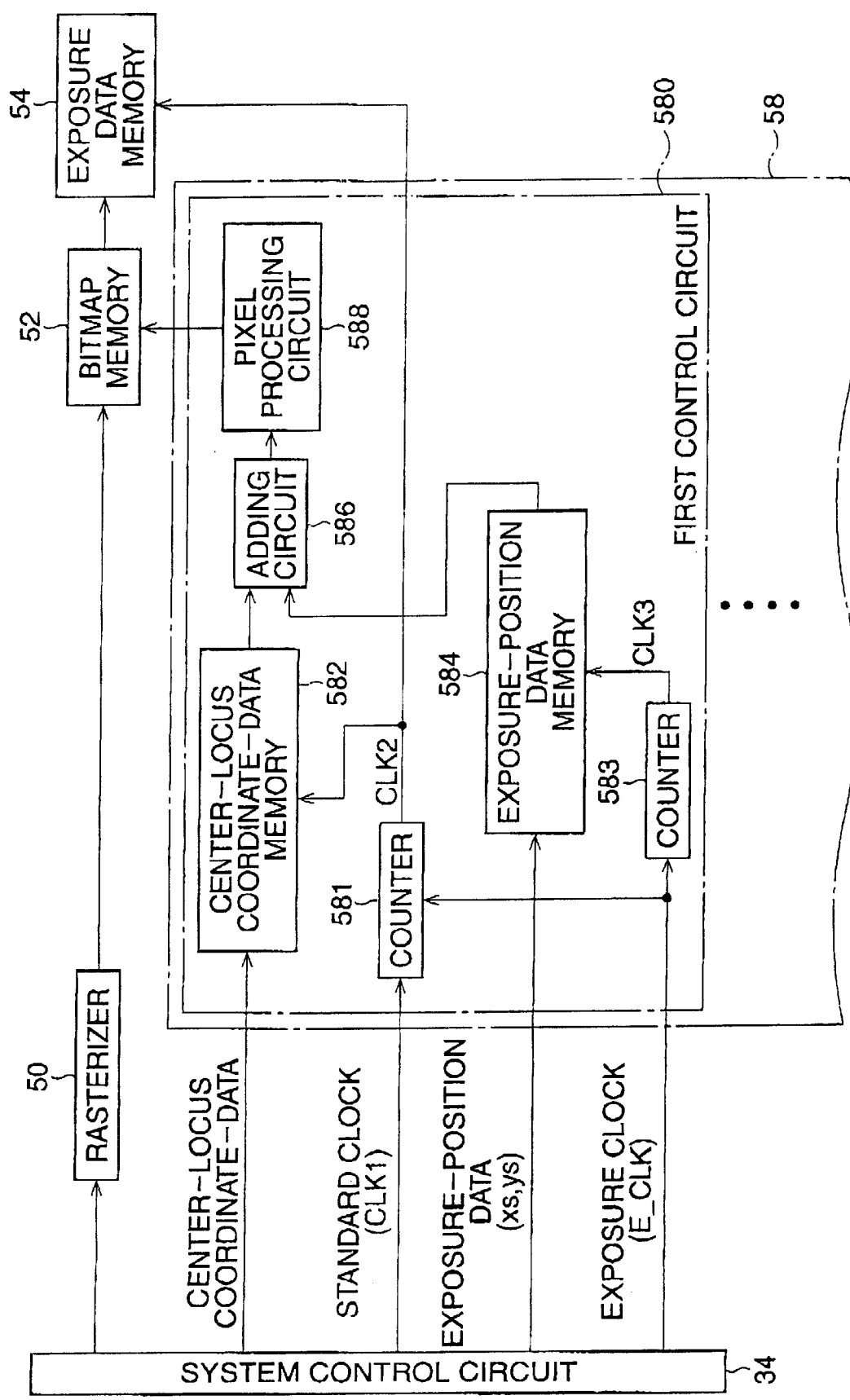
FIG. 10 is a block diagram showing details of the address control circuit.

FIG. 10 is a block diagram illustrating the detailed construction of the address control circuit 58 shown in FIG. 7. Although, in the address control circuit 58, control circuits are provided for each of the fifteen exposure units $20_{01}$ to $20_{15}$, only a first control circuit 580 for the first exposure unit $20_{01}$ is illustrated in the figure, so that the rest of the fourteen control circuits are omitted.

A center-locus coordinate data memory 582 (the second memory) is provided for the first control circuit 580. The coordinate data of 1310720 center loci CN(m,n), which correspond to the micro-mirror elements M(m,n) arranged in 1024×1280 matrix, are stored in the center-locus coordinate data memory 582. The center-locus coordinate data (the first coordinate data) is represented by a two-dimensional orthogonal coordinate system of which the origin is at the center locus CN(1,1) produced by the forefront micro-mirror element M(1,1) in the first array. The two axes of the coordinate system are parallel with the X-axis and the Y-axis, respectively. The center-locus coordinate-data is fed from the system control circuit 34 each time when a drawing operation is performed on the drawing surface 32, so that the data is renewed.

A standard clock pulse CLK1 and an exposure clock pulse E_CLK, which are output from the system control circuit 34, are input to a counter device 581 and 583 of the first control circuit 580. Outputs from the counter device 581 are fed to the center-locus coordinate data memory 582 and the exposure-data memory 54.

The standard clock pulse CLK1 is a synchronizing signal for operating each of the 1310720 micro-mirror elements in order. The exposure clock pulse E_CLK controls the exposure starting time of the first exposure unit $20_{01}$. The period of the exposure clock pulse E_CLK is greater than or equal to 1310720 times the period of the standard clock pulse CLK1.

The counter device 581 counts the number of the standard clock pulse CLK1 and outputs the count-number. The count-number is reset every time when an exposure clock pulse E_CLK is input. Therefore, a count-number output from the counter device 581 corresponds to the address data that represents the order of bit-data to be readout from the center-locus coordinate data memory 582 or the exposure-data memory 54 for each micro-mirror element.

Further, the first control circuit 580 is provided with an exposure-position-data memory 584 (the third memory). Exposure-position data which identifies the position of the first exposure unit $20_{01}$ relative to the drawing surface 32 is stored in the exposure-position-data memory 584 and is altered for each exposure operation. Concretely, the coordinate data of the center locus CN(1,1), which corresponds to the forefront micro-mirror element M(1,1), of the first array, is stored in the exposure-position-data memory 584 as the exposure-position data. The exposure-position data (the second coordinate data) is provided from the system control circuit 34 for each drawing operation in order to renew the data.

The exposure clock pulse E_CLK from the system control circuit 34 is input to a counter device 583 of the first control circuit 580, so that the number of the pulse is counted. The count-number is output to the exposure-position data memory 584 as address data, which identifies the exposure-position data to be readout from the exposure-position data memory 584.

The center-locus coordinate data memory 582 in turn outputs center-locus coordinate data to an adding circuit 586 for every renewal of the address, which is synchronized with the standard clock pulse CLK1. Further, the exposure-position data memory 584 in turn outputs exposure-position data to the adding circuit for every renewal of the address, which is synchronized with the exposure clock pulse E_CLK. In the adding circuit 586, the current exposure-position data is added to the center-locus coordinate data, and the result is output to a pixel processing circuit 588. In the pixel processing circuit 588, since the value of the exposure-position data and the center-locus coordinate data are expressed by the unit "$\mu$m", these data are transformed to data which are based upon the pixel size "PS" of the raster-data to be drawn. The transformed data will indicate the address data $[L_x, R_y]$ of the raster-data to be readout from the bitmap memory 52.

According to the multi-exposure drawing apparatus 10 of the present embodiment, a fine circuit pattern can be drawn even after a coordinate transformation is performed. Namely, an unwanted rotation or shift which occurs when the workpiece 30 is positioned on the drawing table 16, or deformation of the workpiece 30 itself, such as small expansion and contraction, can be compensated by a coordinate transformation without reducing the resolution of the circuit pattern.

Figure 11A:
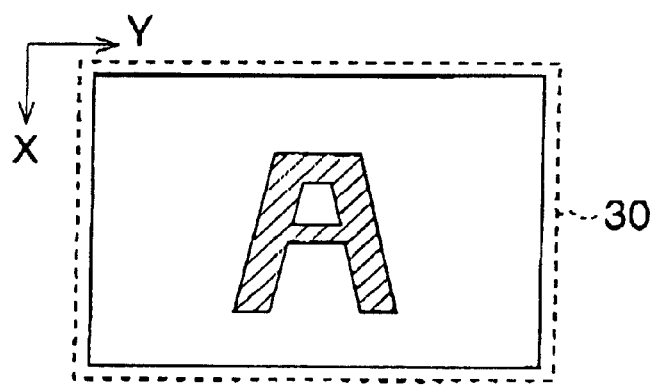
FIGS. 11A and 11B conceptually show a principle of a coordinate transformation performed in the present embodiment.
Figure 11B:
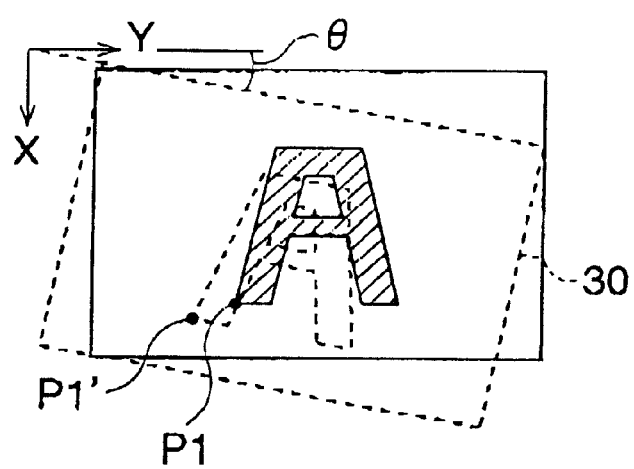

With reference to FIGS. 11A and 11B, the principle of the coordinate transformation are described in the following. In FIG. 11A, the pattern "A" is illustrated as an example of a circuit pattern to be drawn. When the workpiece is accurately positioned at the area illustrated by the broken line and when the workpiece 30 has no deformation such as expansion or contraction, the circuit pattern "A" can be drawn without any coordinate transformation. However, when the circuit pattern is drawn on the workpiece 30 which is in an error positioned with a tilt "$\theta$" to the clockwise direction from the Y-axis, as shown in FIG. 11B, the circuit pattern "A" drawn on the workpiece 30 is tilted "$-\theta$". Therefore, in order to draw a circuit pattern accurately on the workpiece 30, the workpiece 30 should be repositioned to the position shown in FIG. 11A by relative rotation "$-\theta$" of the workpiece 30 together with the drawing table 16, or the circuit pattern should be relatively rotated "$\theta$" by a coordinate transformation, to the position indicated with the broken lines in FIG. 11B. In the present embodiment, the movement of the drawing table 16 is restricted to the translation along the X-axis, so that a coordinate transformation, such as a rotation, is carried out on a circuit pattern to compensate for any unwanted tilt.

Concretely, coordinate transformations are performed by redefining the correspondence between a circuit pattern and the micro-mirror elements. For example, in order to perform the above rotation "$\theta$" for a circuit pattern, a micro-mirror element that corresponds to the pixel P1' (a pixel derived from the pixel P1 of the circuit pattern "A" by the above rotation "$\theta$") is activated instead of the micro-mirror element which corresponds to the pixel P1, so that the pixel P1' is exposed in place of the pixel P1. In other words, circuit pattern data to be supplied to the micro-mirror elements for the pixel P1' is the data for the pixel P1 which corresponds to the position derived by the relative rotation "$-\theta$" from the pixel P1'. Namely, a circuit pattern can be substantially rotated for an angle "$\theta$" by performing the rotation "$-\theta$" for the center-locus coordinate data (which corresponds to the center of the micro-mirror elements) and carrying out the exposure operation in accordance with the bit-data corresponding to the center-locus coordinate data obtained by the rotation.

As described above, a circuit pattern drawn on the drawing surface 32 is relatively rotated in a direction opposite to a rotation of the center-locus coordinate data. A magnification, a reduction, and a translation can be performed by a similar method. Namely, a circuit pattern on the drawing surface 32 is magnified when the center-locus coordinates are reduced. Contrary, a circuit pattern on the drawing surface 32 is reduced when the center-locus coordinates are magnified. Further, a desired translation can be performed by translating the center-locus coordinates to the counter direction. Namely, when the center-locus coordinates are transformed, the circuit pattern produced on the drawing surface 32 is transformed inversely.

Note that, the above coordinate transformations are carried out by the system control circuit 34 for each drawing operation successively, and the transformed data is supplied to the center-locus coordinate data memory 582 as center-locus coordinate data. In the exposure-data memory 54, bit-data of the circuit pattern for which coordinates are transformed is stored, thereby the circuit pattern after the coordinate transformation is produced on the drawing surface.

As described above, according to the present embodiment, a coordinate transformation is performed by controlling the address of the readout operation for the raster-data of a circuit pattern, so that transforming the coordinates directly is not necessary for the raster-data that is stored in the bitmap memory 52. Therefore, exclusive hardware for a scaling and so on is not required. Further, a mechanism for rotating the drawing table 16 or a mechanism for controlling an optical system is not required. As a result, the control mechanism is simplified.

The relations between the micro-mirror elements M(m,n) of the exposure unit $20_{01}$ and each of the bit-data "B" are explained in the following.

When the exposure unit $20_{01}$ is positioned at the first exposure position, the X-Y coordinates (x(m),y(n)) ($1 \leq m \leq 1024, 1 \leq n \leq 1280$) of the center locus CN(m,n) for a unit exposure area U(m,n), which is produced by any of micro-mirror elements, is described in the following equations.

$$x(m)=Xp(m)=(m-1)C$$

$$y(n)=Yp(n)=(n-1)C$$

where the value "C" corresponds to the size of the unit exposure area, and Xp(m) and Yp(n) correspond to the center-locus coordinate data.

When a rotation is required, the center-locus coordinate data Xp(m) and Yp(n) are transformed by the following equations.

$$Xp(m)'=Xp(m)\cdot\cos\theta-Yp(n)\cdot\sin\theta$$

$$Yp(n)'=Xp(m)\cdot\sin\theta+Yp(n)\cdot\cos\theta$$

where Xp(m)' and Yp(n)' represent the center-locus coordinate data after carrying out the coordinate transformation. Note that, the above rotation is applied to a circuit pattern when it is relatively rotated "$-\theta$" in the X-Y coordinate system.

Further, when a magnification or a reduction is required, the coordinate transformation is described in the following equations.

$$Xp(m)'=Xp(m)\cdot\beta$$

$$Yp(n)'=Yp(n)\cdot\beta$$

where β represents the magnification or reduction.

Furthermore, when a translation is required, the coordinate transformation is described in the following equations.

$$Xp(m)'=Xp(m)+X\gamma$$

$$Yp(n)'=Yp(n)+Y\gamma$$

where Xγ and Yγ represent the amounts of translation along the X-axis and Y-axis, respectively.

When the exposure unit $20_{01}$ reaches the $i^{th}$ exposure position by successive translations along the X-axis from the first exposure position, where each of the translations has a regular interval (A+a), the exposure-position data Xs(i) and Ys(i) at the $i^{th}$ exposure position are described in the following equations.

$$Xs(i)=(A+a)\cdot(i-1) \quad (1)$$

$$Ys(i)=b\cdot(i-1) \quad (2)$$

where i represents the number of exposure operations and b represents the amount of the shift along the Y-axis when the exposure unit $20_{01}$ is moved by the interval (A+a) along the X-axis, as mentioned above.

Note that, when a rotation is performed for the center loci, compensation based on the displacement of the center loci generated by the rotation should be taken into consideration. Namely, when the rotation is performed, the equation (2) is altered by the following equation 3.

$$Ys(i)=b(i-1)+(A+a)(i-1)\cdot\tan\theta \quad (3)$$

Therefore, when the exposure unit $20_{01}$ is at the $i^{th}$ exposure position, the coordinates (x(m), y(n)) of the center locus CN(m,n) are represented by the following equations.

$$x(m)=Xs(i)+Xp(m)' \quad (4)$$

$$y(n)=Ys(i)+Yp(n)' \quad (5)$$

At the $i^{th}$ exposure position, when the coordinates (x(m), y(n)) of the center locus CN(m,n) for the unit exposure area U(m,n), which is produced by a micro-mirror element, is included in a certain pixel area, the address [Lx, Ry] of the bit-data "B" for the above pixel area can be described by using the results of the equations (4) and (5), as follows.

$$Lx=INT[x(m)/PS]+1 \quad (6)$$

$$Ry=INT[y(n)/PS]+1 \quad (7)$$

Herein, the operator INT[e/f] represents the quotient of "e/f". When the value "e" is in the range of $0 \leq e \leq f$, the result of INT[e/f] is defined as "0". Further, "PS" represents the size of the bit-data "B".

Consequently, the micro-mirror element, which corresponds to the coordinates (x(m),y(n)), is operated in accordance with the bit-data "B" indicated by the address [Lx, Ry] which is determined by the results of the equations (6) and (7).

When the result of the coordinate component x(m), i.e. the result of the equation (4), is x(m)<0, the center locus CN(m,n) of the coordinates (x(m), y(n)) has not yet entered the drawing area of the drawing surface 32. Therefore, the micro-mirror element corresponding to the coordinates (x(m),y(n)) in such condition is operated by the dummy-data "0", since no bit-data for operating the micro-mirror element exists.

Further, when the result of the coordinate component y(n), i.e. the result of the equation (5), is y(n)<0, the center locus CN(m,n) of the coordinates (x(m),y(n)) exceed the negative area of the Y-axis of the drawing area. Therefore, the micro-mirror element corresponding to the coordinates (x(m),y(n)) in such a condition is also operated by the dummy-data "0", since no bit-data for operating the micro-mirror element exists.

The same is true for the remaining exposure units $20_{02}$ to $20_{15}$ in the first and second arrays, so that which bit-data "B" should operate a micro-mirror element in each of the exposure units $20_{02}$ to $20_{15}$ can also be determined by the above method. However, the fact that the exposure units $20_{03}, 20_{05}$, ..., $20_{15}$ in the first array are aligned toward the positive direction along the Y-axis in relation to the exposure unit $20_{01}$ should be taken in consideration when calculating the above equations for the exposure units $20_{03}, 20_{05}, \ldots, 20_{15}$. Further, the fact that the exposure unite $20_{02}, 20_{04}, \ldots, 20_{14}$ in the second array are shifted to the negative direction along the X-axis and aligned toward the positive direction along the Y-axis in relation to the exposure unit $20_{01}$ should also be taken in consideration when calculating the above equations for the exposure units $20_{02}, 20_{04}, \ldots, 20_{14}$.

Note that, in the present embodiment, a coordinate transformation is carried out on the center-locus coordinate data $Xp(m)$ and $Yp(n)$, however, the same result can be obtained when the coordinate transformation is carried out on the exposure-position data $Xs(i)$ and $Ys(i)$. Further, when a rotation is performed on the center-locus coordinate data $Xp(m)$ and $Yp(n)$, the exposure-position data $Ys(i)$ is compensated in accordance with an angle "θ" (refer Eq. (3). However, when the exposure-position data $Xs(i)$ and $Ys(i)$ is rotated, the center-locus coordinate data $Xp(m)$ and $Yp(n)$ should be compensated based on the rotation "θ".

Figure 12:
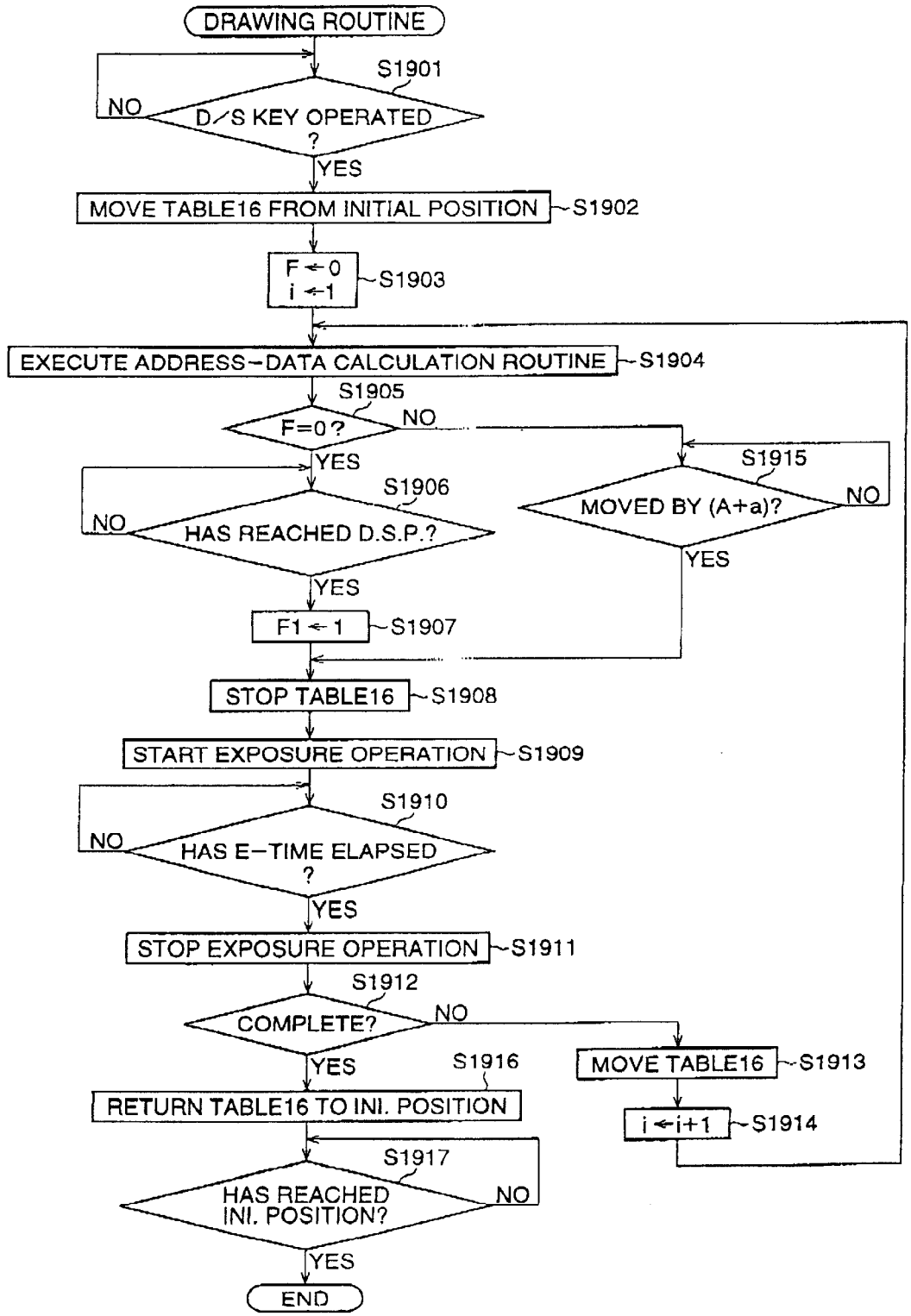
FIG. 12 is a flowchart of a drawing routine executed in a system control circuit of the multi-exposure drawing apparatus.

FIG. 12 is a flowchart of a drawing routine executed in the system control circuit 34. The execution of the drawing routine starts when a power switch (not shown) of the multi-exposure drawing apparatus is turned on.

In Step 1901, whether a drawing-key (D/S key) allocated to a key on the keyboard 48 has been operated is determined. Note that, before the drawing-key is operated, circuit pattern data (vector data) is converted to raster-data, and the circuit pattern data (raster-data) is already developed and stored in the bitmap memory 52. Further, various data required for the drawing routine execution, such as distance data "A", "a", and "b", exposure time data, and transfer speed data of the drawing table, are already input by operating the keyboard 48, and are stored in the RAM provided in the system control circuit 34.

When the operation of the drawing-key is confirmed in Step 1901, the control proceeds to Step 1902, in which the drive motor 36 is activated so that the drawing table 16 is moved from the initial position toward the negative direction of the X-axis at a predetermined speed. In other words, the exposure units $20_{01}$ to $20_{15}$ are moved toward the positive direction of the X-axis in relation to the drawing table 16. Note that, a workpiece is disposed at a predetermined position on the drawing table 16, so that the drawing-start position of the drawing surface of the workpiece is identified with respect to the origin of the X-Y coordinate system when the drawing table 16 is settled at the initial position.

In Step 1903, a flag F is initialized to "0", and the counter "i" is initialized to "1". The flag F is used to indicate whether the exposure units $20_{01}, 20_{03}, \ldots, 20_{15}$ in the first array have reached a drawing-start position (i.e. the first exposure position) of the drawing surface 32 of the workpiece disposed on the drawing table 16. When the exposure units $20_{01}, 20_{03}, \ldots, 20_{15}$ in the first array reach the first exposure position, the flag F is altered from "0" to "1". Further, the counter "i" is for counting the number of the exposure operations, which are carried out by the drawing apparatus, so that the initial value of the counter "i" is set to "1".

When the initialization of the flag F and the counter "i" completes, the control proceeds to Step 1904. In Step 1904, an address-data calculating routine is executed so that the address-data of the bit-data "B" to be readout from the bitmap memory 52 for the first exposure operation is calculated.

In Step 1905, it is determined whether the flag F is "0". In the initial state, the value of flag F is "0", so that the control proceeds to Step 1906, and then whether the exposure units $20_{01}, 20_{03}, \ldots, 20_{15}$ in the first array have reached the drawing-start position (DSP), i.e. the first exposure position, is monitored. When the exposure units $20_{01}, 20_{03}, \ldots, 20_{15}$ in the first array reach the first exposure position, the control proceeds to Step 1907 and the flag F is altered from "0" to "1", then the control proceeds to Step 1908. In Step 1908, the drive motor 36 is stopped so that the movement of the drawing table 16 is interrupted.

In Step 1909, the address-data [Lx,Ry] calculated in the address-data calculating operation (Step 1904) is output from the address control circuit 58 to the bitmap memory 52, thereby a predetermined bit-data "B" is readout from the bitmap memory 52 and sent to the DMD drive circuit 56. Namely, the first exposure operation performed by the exposure units $20_{01}$ to $20_{15}$ is carried out in accordance with the bit-data "B" readout from the bitmap memory 52.

Note that, at the first exposure operation, the center of the unit exposure areas produced by the micro-mirror elements which are aligned on the second line along the Y-axis or the lines above the second line, and which are included in the exposure units $20_{01}, 20_{03}, \ldots, 20_{15}$ of the first array, have not yet entered the drawing area of the drawing surface 32. Therefore, only the micro-mirror elements which are aligned in the first line along the Y-axis, and which are included in the first array exposure units $20_{01}, 20_{03}, \ldots, 20_{15}$ are activated. Therefore, micro-mirror elements in the second line or above are operated by the dummy-data "0". Further, at this moment, the exposure units $20_{02}, 20_{04}, \ldots, 20_{14}$ in the second array have not yet reached the drawing-start position, every micro-mirror element of each exposure unit $20_{02}, 20_{04}, \ldots, 20_{14}$ in the second array is operated by the dummy-data "0", so that the exposure operations of the exposure units $20_{02}, 20_{04}, \ldots, 20_{14}$ in the second array are substantially not performed.

In Step 1910, it is monitored whether the exposure time (E-time) has elapsed. When the lapse of the exposure time is confirmed, the control proceeds to Step 1911, in which the exposure operations for all exposure units $20_{01}$ to $20_{15}$ are stopped. Then the control proceeds to Step 1912, and whether a drawing of the circuit pattern with the exposure units $20_{01}$ to $20_{15}$ has been completed is determined.

Of course, at this moment, the circuit pattern drawing is not yet completed, so that the control proceeds to Step 1913, in which the drawing table 16 is again moved toward the negative direction of the X-axis. In Step 1914, the value of the counter "i" is incremented by "1", and then the control returns to Step 1904 in order to prepare for the second exposure operation of the exposure units $20_{01}$ to $20_{15}$.

In Step 1904, the address-data calculating routine is again executed, and address-data of the bit-data "B" to be readout from the bitmap memory 52 in the second exposure operation are calculated. Then, the control proceeds to Step 1905, and whether the flag F is "0" is determined. At this moment, the value of the flag F is "1", so that the control proceeds to Step 1915 from Step 1905, in which it is monitored whether the drawing table 16 is moved by the distance "A+a". When the movement of the drawing table 16 by the distance "A+a" is confirmed, the control proceeds to the Stop 1908, in which the drive motor 36 is stopped so that the movement of the drawing table 16 is interrupted. Then, in Step 1909, the second exposure operation by the exposure units $20_{01}$ to $20_{15}$ is performed in accordance with the bit-data "B" readout from the bitmap memory 52.

Namely, for each time when the drawing table 16 is moved by the distance (A+a), the exposure operations with the exposure units $20_{01}$ to $20_{15}$ are repeated in order, and these exposure operations are continued until the completion of the drawing of the circuit pattern with the exposure units $20_{01}$ to $20_{15}$ is confirmed.

In Step 1912, when the completion of the drawing of the circuit pattern is confirmed, the control proceeds from Step 1912 to Step 1916, in which the driving of the drive motor 36 is reversely driven and the drawing table 16 is moved toward the initial position. Then in Step 1917, whether the drawing table has reached the initial position is monitored.

When it is confirmed that the drawing table 16 has reached the initial position, the drive motor 36 is stopped and this routine ends.

In the above described embodiment, during the drawing operations, the drawing table 16 is stopped each time when the drawing table 16 reaches the exposure position so that the exposure operation is executed by the exposure units $20_{01}$ to $20_{15}$ therein. However, it is possible to execute the drawing operations by moving the drawing table at a constant velocity continuously under certain conditions, without any intermittent movement. Namely, the exposure operation is carried out by the exposure units $20_{01}$ to $20_{15}$ each time when the drawing table 16 is moved the regular intervals of "A+a", and an exposure time is set at a shorter time than the time during which the drawing table 16 is moved by the distance "d"; where "d" is the size of a unit exposure area (20 μm).

A circuit pattern can be drawn in a manner similar to the above embodiment, when the exposure time is set at the above interval. In addition, the drawing time required for drawing a circuit pattern is reduced. Further, as another advantage of continuous movement of the drawing table at constant speed, damage induced in the driving mechanism is avoided.

As described above, according to the present invention, although any pixel size can be set for the pattern data, the given pattern can be drawn appropriately, so that flexibility of design in a CAD station or CAM station is dramatically improved by using the multi-exposure drawing apparatus of the present invention.

Further, in the multi-exposure drawing apparatus of the present invention, a coordinate transformation of a circuit pattern is performed by controlling the address to be readout, so that specialized hardware for the coordinate transformation is not required thus the circuit pattern is easily transformed. Particularly, jaggy edges produced along a slanted line or a curved line due to a size of a pixel is prevented and a smooth line can be obtained in any situation, so that a fine circuit pattern is drawn even when a horizontal or perpendicular line is slanted by a coordinate transformation.

Further, another advantage of the present invention, although any one of the optical modulation elements of the exposure unit may malfunction, the circuit pattern can be drawn properly without exchanging the exposure unit. This is because a pixel area is produced by the multi-exposure manner, using a plurality of different modulation elements or micro-mirror element, so that even when some of exposure operations are abnormally carried out, the pixel area can receive a sufficient amount of light.

Further, although exposure for each pixel area is not uniform due to a focusing lens system provided in each exposure unit, significant differences are reduced by using the multi-exposure method. Furthermore, sufficient exposure can be obtained when using the multi-exposure operation, even when the power of a light source device is low, thus a low price light source device can be used.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Application No. 2001-240411 (filed on Aug. 8, 2001) which is expressly incorporated herein, by reference, in its entirety.

What is claimed is:

1. A multi-exposure drawing apparatus that draws a given pattern on a drawing surface by using a multi-exposure method, and an exposure unit including a plurality of optical modulation elements arranged in a matrix, which comprises:
   a first memory that stores raster-data of said given pattern;
   a second memory that stores first-coordinate data which represents a position of each of said optical modulation elements relative to said drawing surface;
   a third memory that stores second-coordinate data which represents a position of said exposure unit relative to said drawing surface;
   a coordinate transformation processor that is able to perform a coordinate transformation on one of said first-coordinate data and said second-coordinate data;
   a calculating processor that calculates address-data in accordance with a pixel size used for said raster-data, and based on the sum of said first-coordinate data and said second-coordinate data; and
   an exposure-data generating processor that generates exposure-data for each of said optical modulation elements, by means of reading out said raster-data corresponding to said address-data from said first memory;
   wherein a pattern that is obtained by reversing said coordinate transformation of said given pattern, is drawn on said drawing surface as a result of said coordinate transformation performed on one of said first-coordinate data and said second-coordinate data.

2. A multi-exposure drawing apparatus according to claim 1, wherein said coordinate transformation comprises one of a rotation, magnification, reduction, and translation.

3. A multi-exposure drawing apparatus according to claim 1, wherein said coordinate transformation comprises a rotation, and one of said first-coordinate data and said second-coordinate data is rotated at a predetermined angle, thereby the other coordinate data is compensated as to said predetermined angle.

4. A multi-exposure drawing apparatus according to claim 1, further comprising:
   a moving processor that moves said exposure unit relative to said drawing surface, along a direction inclined at a predetermined angle from one of the alignments of said optical modulation elements arranged in said matrix;
   an exposure processor that selectively controls exposure operations of said optical modulation elements in accordance with said given pattern each time when said exposure unit is moved relative to said drawing surface by a distance "A+a", in which said distance "A" corresponds to an integer-multiple of a size of a unit exposure area produced on said drawing surface by each optical modulation element, and said distance "a" corresponds to a distance smaller than said distance "A".

5. A multi-exposure drawing method for drawing a given pattern on a drawing surface by a multi-exposure method, using an exposure unit including a plurality of optical modulation elements arranged in a matrix, which comprises:
   a first step that stores raster-data of said given pattern, in a first memory;
   a second step that stores first-coordinate data which represents a position of each of said optical modulation elements relative to said drawing surface, in a second memory;
   a third step that stores second-coordinate data which represents a position of said exposure unit relative to said drawing surface, in a third memory;

a fourth step in which a coordinate transformation is performed for one of said first-coordinate data and said second-coordinate data;

a fifth step in which address-data is calculated in accordance with a pixel size used for said raster-data, and is based on the sum of said first-coordinate data and said second-coordinate data;

a sixth step in which exposure-data is generated for each of said optical modulation elements by means of reading out said raster-data corresponding to said address-data from said first memory; and a seventh step in which each of said optical modulation elements is operated in accordance with said exposure-data;

wherein a pattern that is obtained by reversing said coordinate transformation of said given pattern, is drawn on said drawing surface as a result of said coordinate transformation performed on one of said first-coordinate data and said second-coordinate data.

* * * * *